US 9,035,546 B2

(12) United States Patent
Choi et al.

(10) Patent No.: US 9,035,546 B2
(45) Date of Patent: May 19, 2015

(54) ORGANIC LIGHT EMITTING DISPLAY DEVICE AND METHOD FOR MANUFACTURING THE SAME

(75) Inventors: Hee-Dong Choi, Seosan-si (KR); Sam-Min Ko, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 355 days.

(21) Appl. No.: 13/337,936

(22) Filed: Dec. 27, 2011

(65) Prior Publication Data

US 2012/0256973 A1    Oct. 11, 2012

(30) Foreign Application Priority Data

Apr. 7, 2011    (KR) .................. 10-2011-0032369

(51) Int. Cl.
| | |
|---|---|
| *H01L 51/50* | (2006.01) |
| *H01L 51/52* | (2006.01) |
| *H01L 27/12* | (2006.01) |
| *H01L 27/32* | (2006.01) |

(52) U.S. Cl.
CPC ......... *H01L 51/5253* (2013.01); *H01L 27/1259* (2013.01); *H01L 27/3244* (2013.01)

(58) Field of Classification Search
CPC ............ H01L 27/3244; H01L 27/3258; H01L 27/1259; H01L 51/5262; H01L 51/5253; H01L 51/5284; G02F 1/1339; G02F 1/13454; G02F 2201/50
USPC .................................................. 313/498–512
See application file for complete search history.

(56) References Cited

U.S. PATENT DOCUMENTS

| | | | | |
|---|---|---|---|---|
| 6,992,439 | B2 * | 1/2006 | Yamazaki et al. | 313/512 |
| 7,129,523 | B2 * | 10/2006 | Yamazaki et al. | 257/59 |
| 7,190,115 | B2 * | 3/2007 | Tsuchiya et al. | 313/512 |
| 8,382,545 | B2 * | 2/2013 | Sakakura et al. | 445/23 |
| 2002/0180371 | A1 * | 12/2002 | Yamazaki et al. | 315/169.3 |
| 2004/0066136 | A1 * | 4/2004 | Yoneda et al. | 313/505 |

(Continued)

FOREIGN PATENT DOCUMENTS

| | | |
|---|---|---|
| CN | 101355096 | 1/2009 |
| CN | 100585905 C | 1/2010 |
| JP | 2011-119285 | 6/2011 |

(Continued)

OTHER PUBLICATIONS

Office Action issued in Chineses Patent Application No. 201110461282.1, mailed May 6, 2014, 25 pages.
Office Action issued in Korean Patent Application No. 10-2011-0032369, mailed Sep. 22, 2014, 3 pages.

*Primary Examiner* — Anne Hines
*Assistant Examiner* — Jose M Diaz
(74) *Attorney, Agent, or Firm* — Brinks Gilson & Lione

(57) ABSTRACT

The organic light emitting display device includes an organic light emitting display panel and a data driver, wherein the organic light emitting display panel includes an active region which includes pixel driving TFTs for embodying an image and organic luminescent elements respectively connected with the pixel driving TFTs to emit light, a GIP region which includes a gate driver formed with a plurality of gate driving TFTs for respectively driving gate lines of the active region, a GND region formed between the GIP region and the active region to be formed with a base voltage line for supplying base voltage to the organic luminescent elements of the active region, and a sealant region formed with a sealant for attaching an upper substrate to a lower substrate, and wherein the GND region includes out-gassing blocking holes.

24 Claims, 47 Drawing Sheets

(56) References Cited

U.S. PATENT DOCUMENTS

2004/0217695 A1* 11/2004 Yoneda et al. .............. 313/504
2005/0016462 A1* 1/2005 Yamazaki .................... 118/726
2005/0218396 A1* 10/2005 Tsuchiya et al. .............. 257/13
2009/0309489 A1* 12/2009 Takata et al. ................ 313/504
2011/0263059 A1* 10/2011 Takayama et al. .............. 438/34

FOREIGN PATENT DOCUMENTS

| | | |
|---|---|---|
| KR | 1020080085583 A | 9/2008 |
| KR | 1020090061387 A | 6/2009 |

* cited by examiner

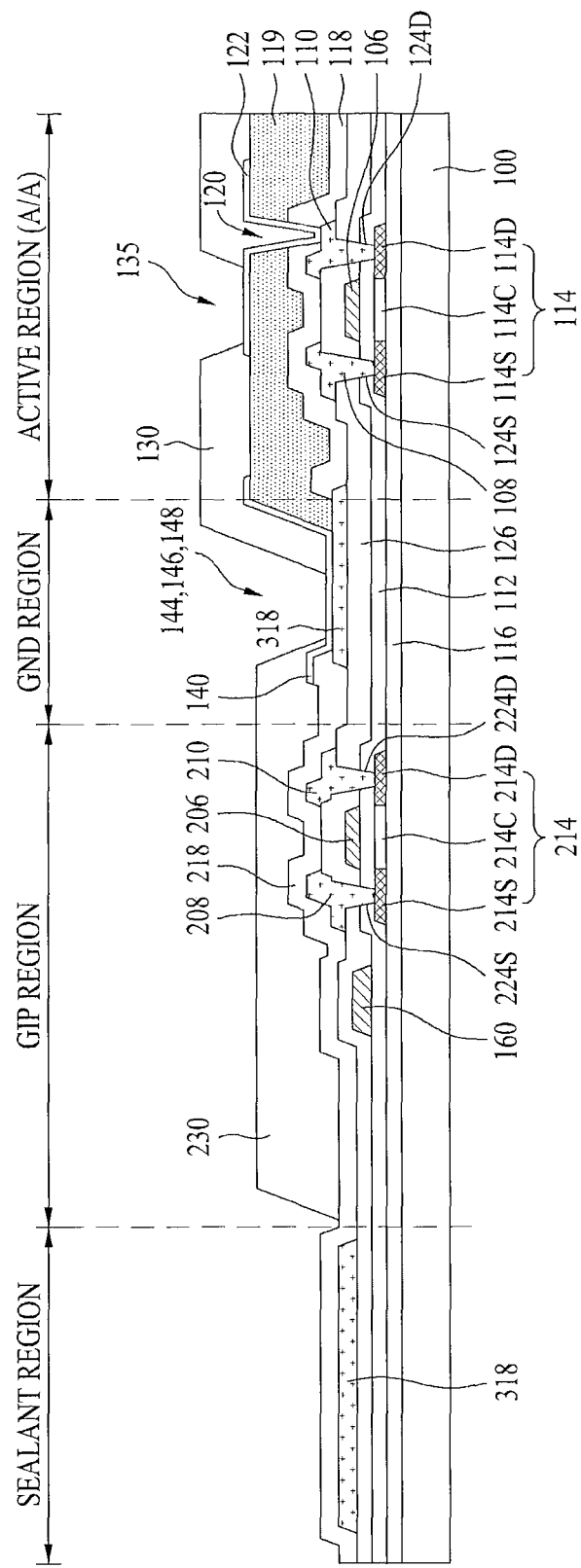

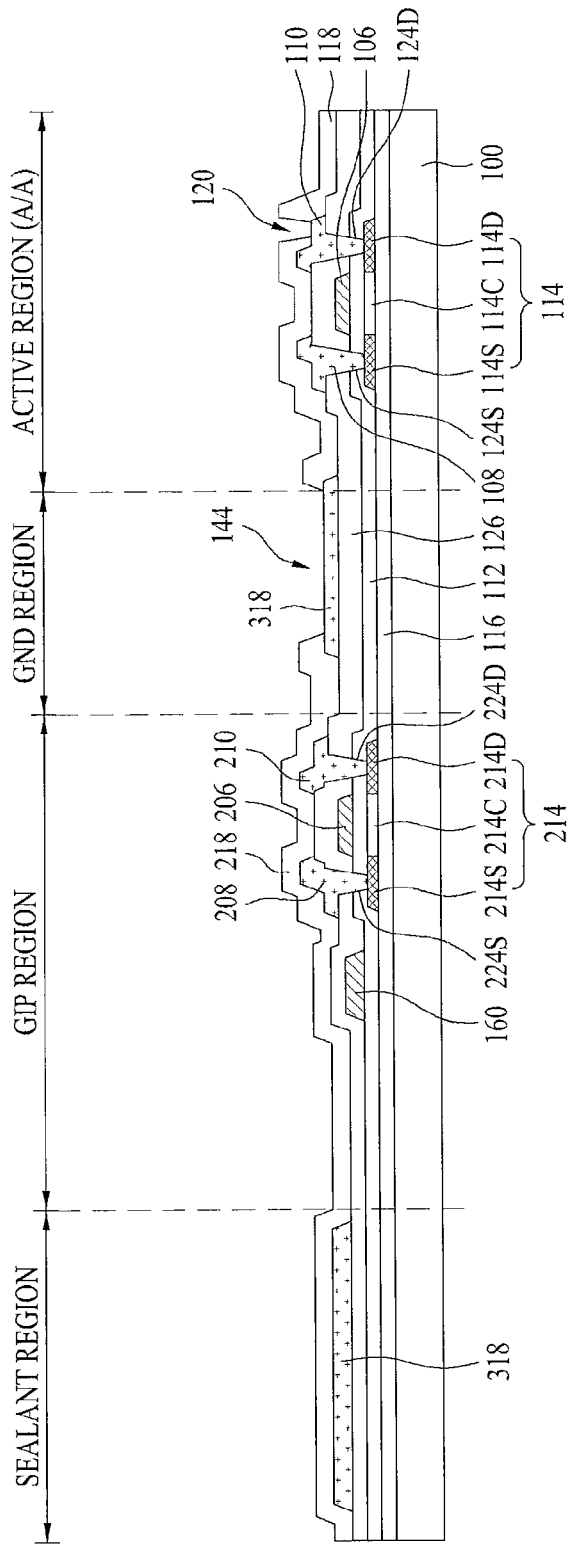

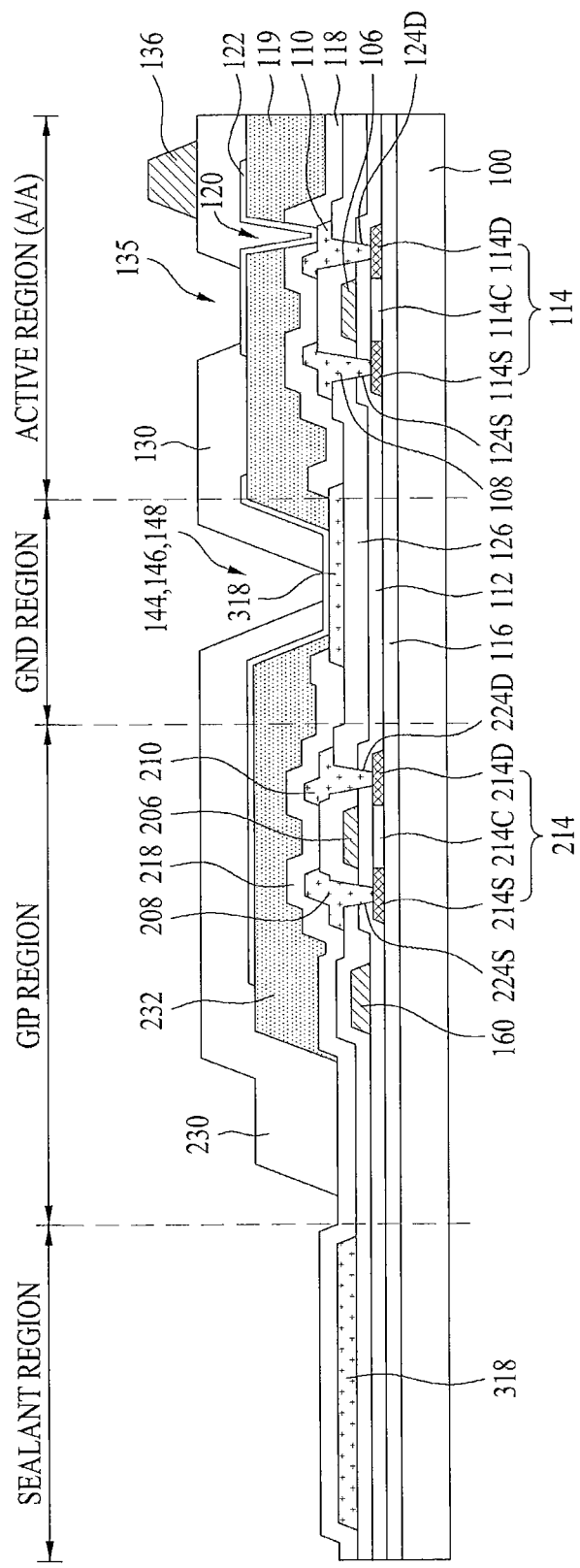

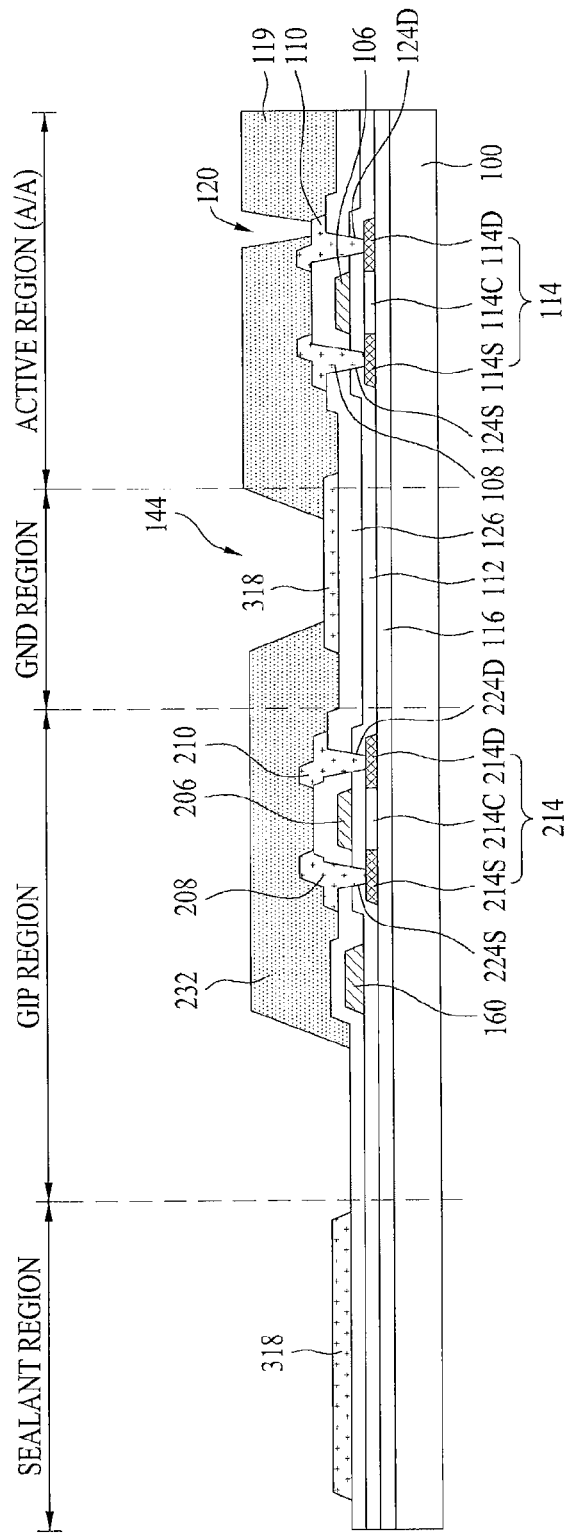

ORGANIC LIGHT EMITTING DISPLAY DEVICE AND METHOD FOR MANUFACTURING THE SAME

This application claims the priority and the benefit under 35 U.S.C. §119(a) on Patent Application No. 10-2011-0032369 filed in Republic of Korea on Apr. 7, 2011, the entire contents of which are hereby incorporated by reference.

BACKGROUND

1. Field of the Invention

The present disclosure relates to an organic light emitting display device and a method for manufacturing the same, and more particularly, to an organic light emitting display device for blocking out-gassing occurring from a GIP region so as to improve a lifespan and luminous efficiency of an organic luminescent element, and to a method for manufacturing the same.

2. Discussion of the Related Art

For an image display device which implements a variety of information on a screen as a core technology in advanced information and communication, there is continuous progress in development of thin, light-weight and/or portable devices with improved performance. The use of an Organic light emitting Display device (OELD) used to control a luminescent amount of an organic luminescent layer to display an image is receiving attention, as a flat display device with reduced weight and volume to overcome problems associated with the weight and volume of a Cathode-Ray Tube (CRT). The OELD is a self-luminescent device using a thin luminescent layer between electrodes and may be manufactured into a thin product in a sheet form.

An Active Matrix type Organic light emitting Display device (AMOELD) includes pixels composed of three colors (R, G, B) sub-pixels arranged in a matrix pattern to display an image. Each of the sub-pixels includes an organic luminescent element and a cell driver for driving the organic luminescent element. The cell driver includes a gate line for provision of a scan signal, a data line for provision of a video data signal, at least two thin film transistors and storage capacitors connected between common power lines for provision of common power signals, so as to drive an anode of the organic luminescent element.

In this case, a gate driver is formed on an organic light emitting display panel, in order to achieve reduction in material costs and the number of processes, and shortened process time. Accordingly, when the gate driver is formed on the organic light emitting display panel, the gate driver is formed adjacent to the organic luminescent element of an active region within a sealant.

The gate driver is formed with a plurality of drive transistors for driving a plurality of gate lines, and at least two organic or inorganic protective films on the plural drive transistors. Thus, out-gassing occurs at the organic protective films formed on the plural drive transistors of the gate driver, thereby being introduced into the organic luminescent element of the active region. Therefore, due to the out-gassing occurring from the gate driver, an organic layer of the organic luminescent element has a short lifespan and deteriorated luminous efficiency.

BRIEF SUMMARY

An organic light emitting display device includes an organic light emitting display panel and a data driver that drive data lines of the organic light emitting display panel, wherein the organic light emitting display panel includes an active region which includes pixel driving TFTs for embodying an image and organic luminescent elements respectively connected with the pixel driving TFTs to emit light, a GIP region which includes a gate driver having a plurality of gate driving TFTs that respectively drive gate lines of the active region, a GND region formed between the GIP region and the active region to be formed with a base voltage line that supplies base voltage to the organic luminescent elements of the active region, and a sealant region having a sealant that attaches an upper substrate to a lower substrate, and wherein the GND region includes out-gassing blocking holes that block out-gassing occurring from the sealant and at least one protective film formed at the GIP region.

In another aspect of the present invention, an organic light emitting display device includes an organic light emitting display panel and a data driver that drives data lines of the organic light emitting display panel, wherein the organic light emitting display panel includes an active region which includes pixel driving TFTs that embody an image and organic luminescent elements respectively connected with the pixel driving TFTs to emit light, a GIP region which includes a gate driver having a plurality of gate driving TFTs that respectively drive gate lines of the active region, an out-gassing blocking region between the GIP region and the active region so as to block out-gassing occurring from the GIP region, a GND region formed with a base voltage line for supplying base voltage to the active region, and a sealant region having a sealant to attach an upper substrate to a lower substrate.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 3A to 3K are sectional views illustrating a method for manufacturing the organic light emitting display device shown in FIG. 2 according to the first embodiment of the present invention;

FIGS. 5A to 5K are sectional views illustrating a method for manufacturing the organic light emitting display device shown in FIG. 4 according to the second embodiment of the present invention;

FIGS. 9A to 9I are sectional views illustrating a method for manufacturing the organic light emitting display device shown in FIG. 8 according to the fourth embodiment of the present invention;

DETAILED DESCRIPTION OF THE DRAWINGS AND THE PRESENTLY PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, the preferred embodiments of the present invention will be described in detail with reference to FIGS. 1 to 11.

Figure 1:
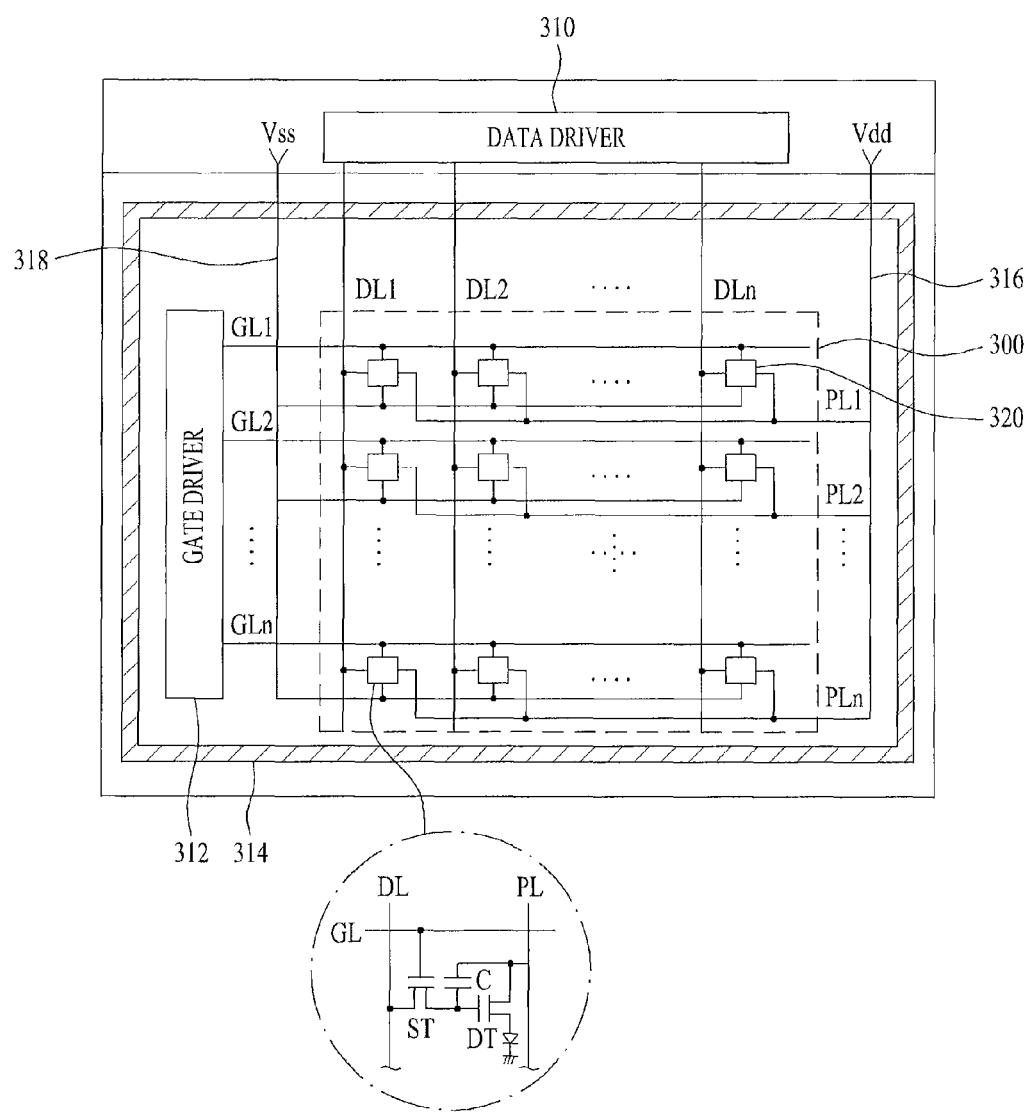
FIG. 1 is a block diagram illustrating an organic light emitting display device according to a first embodiment of the present invention.
Figure 2:
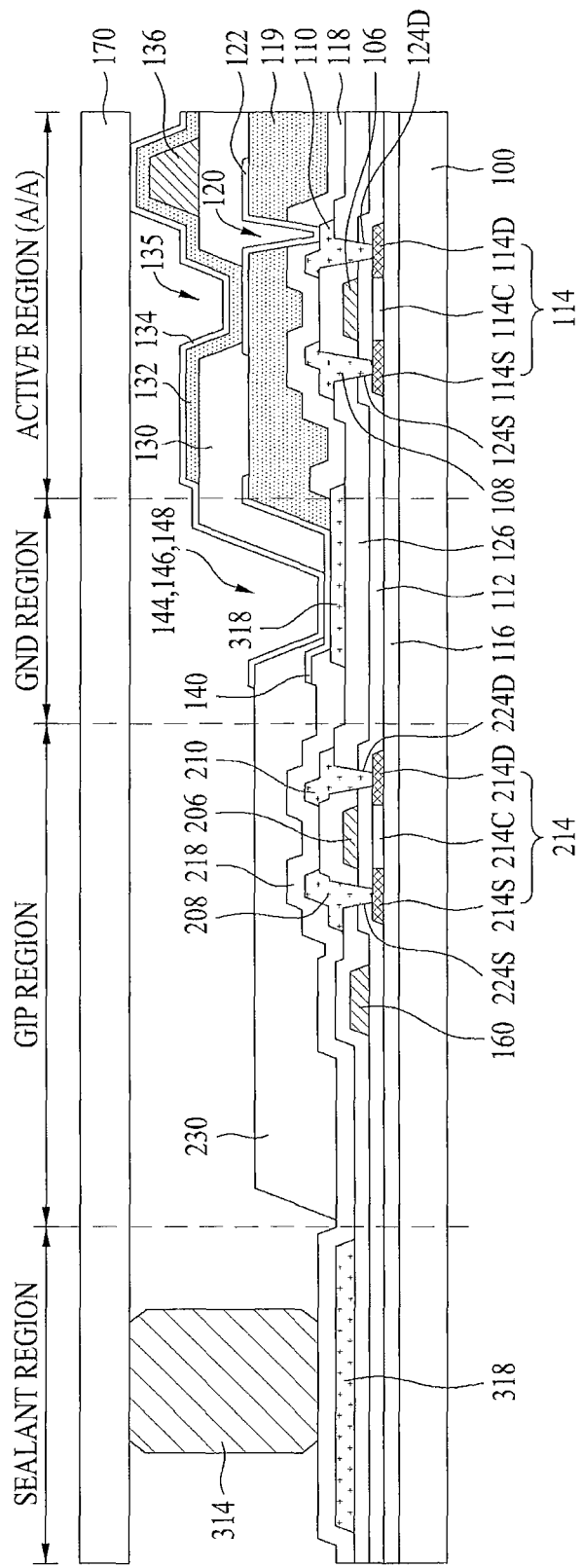
FIG. 2 is a sectional view of the organic light emitting display device shown in FIG. 1 according to the first embodiment of the present invention.

FIG. 1 is a block diagram illustrating an organic light emitting display device according to a first embodiment of the present invention. FIG. 2 is a sectional view of the organic light emitting display device shown in FIG. 1.

As shown in FIGS. 1 and 2, the organic light emitting display device according to the first embodiment of the present invention includes an organic light emitting display panel equipped with an active region 300 or A/A for displaying an image and a gate driver 312 for driving gate lines GL1 to GLn of the active region 300 or A/A, and a data driver 310 for driving data lines DL1 to DLn of the active region 300 or A/A.

The organic light emitting display panel has an upper substrate 170 and a lower substrate 100, which face and are attached to each other. The organic light emitting display panel includes an active region 300 or A/A which includes gate lines GL1 to GLn, data lines DL1 to DLn, power lines PL1 to PLn, and a plurality of pixel areas 320 connected with a base voltage line 318, a GIP region formed with the gate driver 312 for driving the gate lines GL1 to GLn, a GND region formed between the GIP region and the active region to be formed with the base voltage line 318 for supplying base voltage GND to the active region, and a sealant region formed with a sealant 314 for attaching the upper substrate 170 to the lower substrate 100.

Each of the plural pixel areas 320 has a pixel switching TFT ST connected with one gate line GL and one data line DL, a pixel driving TFT DT connected with one power line PL and an anode of a corresponding one of the organic luminescent elements, and a storage capacitor C connected between the power line PL and a drain electrode of the pixel switching TFT ST.

The pixel switching TFT ST is connected at a gate electrode thereof with the gate line GL, at a source electrode thereof with the data line DL, and at a drain electrode thereof with a gate electrode of the pixel driving TFT DT and the storage capacitor C. The pixel driving TFT DT is connected at a source electrode thereof with the power line PL, and at a drain electrode thereof with the anode of the organic luminescent element. The storage capacitor C is connected between the power line PL and the gate electrode of the pixel driving TFT DT.

When the gate line is supplied with a scan pulse, the pixel switching TFT ST is turned on to provide the storage capacitor C and the gate electrode of the pixel driving TFT DT with a data signal transferred to the data line DL. The pixel driving TFT DT responds to the data signal transferred to the gate electrode thereof to control current supplied from the power line PL to the organic luminescent element, thereby adjusting a luminescent amount of the organic luminescent element. Although the pixel switching TFT ST is turned off, the pixel driving TFT DT supplies uniform current due to voltage charged to the storage capacitor C until a data signal of a next frame is provided, and thus the organic luminescent element maintains luminescence.

As shown in FIG. 2, the pixel driving TFT DT is formed with a buffer film 116 and an active layer 114 on the lower substrate 100. The gate electrode 106 of the pixel driving TFT DT is formed to overlap with a channel area 114C of the active layer while a gate insulation film 112 is interposed therebetween. The source electrode 108 and the drain electrode 110 of the pixel driving TFT DT are formed to be insulated from the gate electrode 106 while a layer insulation film 126 is interposed between the gate electrode 106 and each of the source electrode 108 and the drain electrode 110. The source electrode 108 connected with the power line PL and the drain electrode 110 are respectively connected with a source area 114S and a drain area 114D of the active layer 114 into which n+ impurities are injected via a source contact hole 124S and a drain contact hole 124D, respectively, which penetrate both the layer insulation film 126 and the gate insulation film 112. Also, the active layer 114 may further have Lightly Doped Drain (LDD) areas (not shown) into which n− impurities are injected between the channel area 114C and each of the source area 114S and the drain area 114D in order to reduce off-current. In addition, the pixel driving TFT DT includes first and second protective films 118 and 119 which cover the pixel driving TFT DT. The first and second protective films 118 and 119 are formed with a pixel contact hole 120 for exposing the drain electrode 110 of the pixel driving TFT DT. The first protective film 118 may be made of an inorganic insulation material, whereas the second protective film 119 may be made of an organic insulation material.

Each of the organic luminescent elements includes an anode 122 connected with the drain electrode 110 of the pixel driving TFT DT, a bank insulation film 130 formed with a bank hole 135 for exposure of the anode 122, a column spacer 136 formed on the bank insulation film 130 so as to maintain a cell gap, an organic layer 132 formed on the anode 122 exposed through the bank hole 135, and a cathode 134 formed on the organic layer 132. The organic layer 132 includes a positive hole injection layer, a positive hole transport layer, a luminescent layer, an electron transport layer, and an electron injection layer which are stacked from the anode 122. Such an organic layer 132 is luminous depending on a current amount supplied to the anode 122. Depending on the materials of the cathode 134 and the anode 122, front-luminescence which is luminescence from a front surface of a substrate, back-luminescence which is luminescence from a back surface of the substrate, or dual-luminescence which is luminescence from both the front and back surfaces of the substrate may be performed. Meanwhile, the bank insulation film 130 may be made of a polyimide (PI) material that exhibits low outgassing.

The GIP region is formed with the gate driver 312 which includes a plurality of gate driving TFTs for driving the gate lines GL1 to GLn. The GIP region is located adjacent to the sealant region. As shown in FIG. 2, each of the gate driving TFTs is formed with the buffer film 116 and an active layer 214 on the lower substrate 100. A gate electrode 206 of the gate driving TFT is formed to overlap with a channel area 214S of the active layer while the gate insulation film 112 is interposed therebetween. A source electrode 208 and a drain electrode 210 of the gate driving TFT are formed to be insulated from the gate electrode 206 while the layer insulation film 126 is interposed between the gate electrode 106 and each of the source electrode 208 and the drain electrode 210. The source electrode 208 and the drain electrode 210 are respectively connected with a source area 214S and a drain area 214D of the active layer 214 into which n+ impurities are injected via a source contact hole 224S and a drain contact hole 224D, respectively, which penetrate both the layer insulation film 126 and the gate insulation film 112. Also, the active layer 214 may further have Lightly Doped Drain (LDD) areas (not shown) into which n− impurities are injected between the channel area 214C and each of the source areas 214S and the drain areas 214D in order to reduce off-current. In addition, the gate driving TFT includes a first protective film 218 and a bank insulation film 230 which cover the gate driving TFT. The first protective film 218 may be made of the inorganic insulation material, whereas the bank insulation film 230 may be made of a polyimide (PI) material that exhibits low out-gassing.

The GND region is formed between the GIP region and the active region. The GND region includes the base voltage line 318 for supplying the base voltage to the cathode 134 of each organic luminescent element, and out-gassing blocking holes 144, 146, and 148 for blocking out-gassing occurring from the sealant 314 and a plurality of protective films of the GIP region.

The out-gassing blocking holes 144, 146, and 148 are comprised of a first contact hole 144 which is formed between the first protective film 118 formed on the pixel driving TFT and the first protective film 218 formed on the gate driving TFT, a second contact hole 146 which is formed between the second protective film 119 formed on the pixel driving TFT and the first protective film 218 formed on the gate driving TFT, and a third contact hole 148 which is formed between the bank insulation film 130 formed on the pixel driving TFT and the bank insulation film 230 formed on the gate driving TFT.

Each of a plurality of gate driving TFTs of the GIP region is formed with a plurality of protective films such as the first protective film 218 and the bank insulation film 230, and the sealant 314 is made of the organic insulation material. Such an organic insulation material generates out-gassing, such that the out-gassing may infiltrate into the organic layer 132 of the organic luminescent element. However, the present invention may prevent movement of the out-gassing occurring from the material of the sealant or the plural protective films of the GIP region by the out-gassing blocking holes 144, 146, and 148 composed of the plural contact holes between the respective protective films formed on the gate driving TFT of the GIP region and the respective protective films formed on the pixel driving TFT.

Furthermore, the second protective film 119 formed on the pixel driving TFT is generally made of a photo-acrylic (PAC) material. Since such a photo-acrylic (PAC) material is a material that exhibits high out-gassing, the second protective film 119 is not formed on the gate driving TFT, as shown in FIG. 2. Consequently, generation of the out-gassing may be reduced.

The base voltage line 318 supplies the base voltage to the cathode 134 of each organic luminescent element through a corresponding connection electrode 140. The connection electrode 140 is connected with the base voltage line 318 through the first and second contact holes 144 and 146 while being connected with the cathode 134 through the third contact hole 148.

As described above, since the GND region is located between the active region and the GIP region, the out-gassing occurring from the GIP region may be blocked through the out-gassing blocking holes, thereby preventing infiltration of the out-gassing into the organic layer 132 of the organic luminescent element. As a result, a lifespan and luminous characteristics of an organic luminescent element can be improved.

FIGS. 3A to 3K are sectional views illustrating a method for manufacturing the organic light emitting display device shown in FIG. 2 according to the first embodiment of the present invention.

Figure 3A:
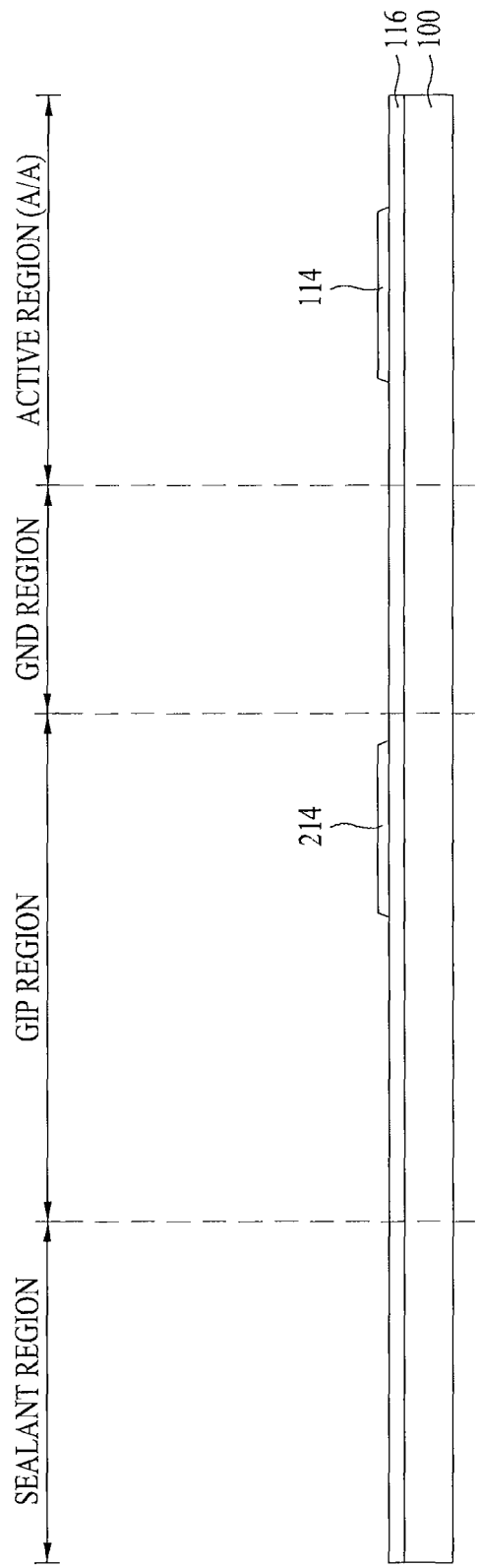

Referring to FIG. 3A, the lower substrate 100 is formed with the buffer film 116, and then the active layers 114 and 214 of the respective pixel driving TFT and gate driving TFT are formed on the buffer film 116.

In detail, the buffer film 116 is formed in such a manner that inorganic insulation materials such as SiO$_2$ and the like are fully deposited on the lower substrate 100. Each of the active layers 114 and 214 is formed in such a manner that, after deposition of amorphous silicon on the buffer film 116, the amorphous silicon is crystallized with a laser to become polysilicon, and then the polysilicon is patterned by a photolithographic process and an etching process.

Figure 3B:
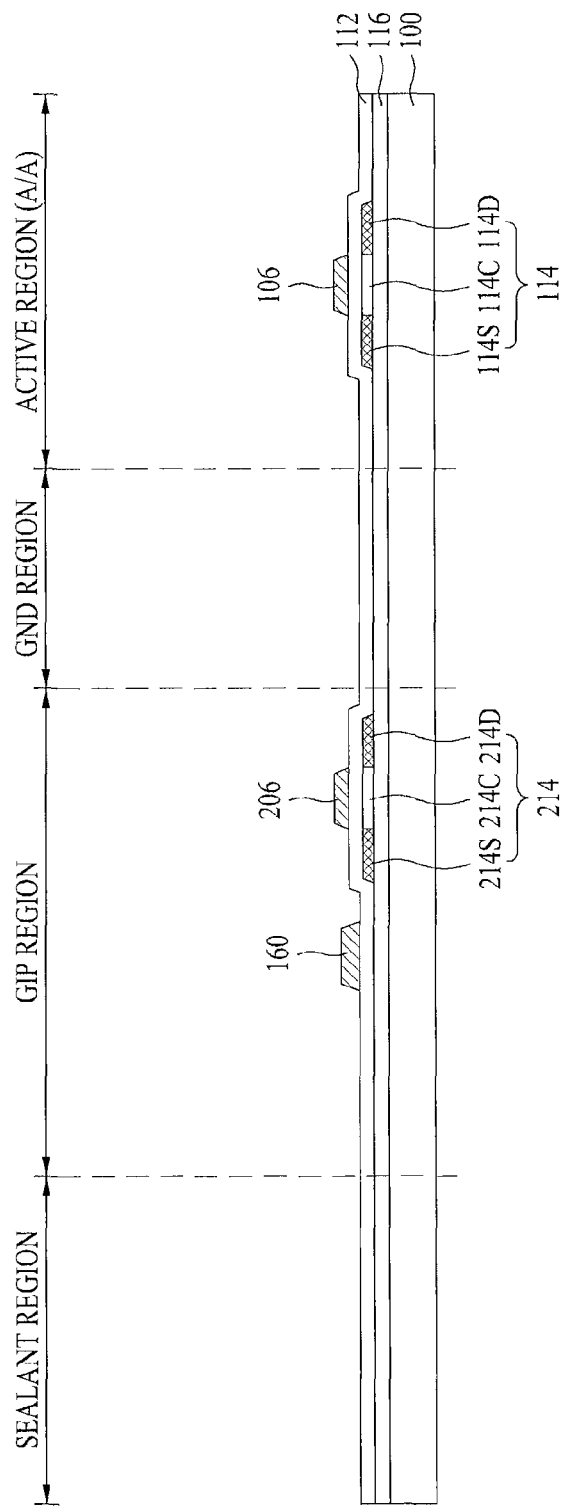

Referring to FIG. 3B, the gate insulation film 112 is formed on the buffer film 116 formed with the active layers 114 and 214. The respective source areas 114S and 214S and the respective drain areas 114D and 214D are formed to face each other while the channel areas 114C and 214C of the active layers 114 and 214 are respectively interposed between the respective source areas 114S and 214S and the respective drain areas 114D and 214D, together with formation of the gate electrodes 106 and 206 of the respective pixel driving TFT and gate driving TFT on the gate insulation film 112.

In detail, the gate insulation film 112 is formed in such a manner that the inorganic insulation materials such as SiO$_2$ and the like are fully deposited on the buffer film 116 formed with the active layers 114 and 214. Each of the gate electrodes 106 and 206 of the respective pixel driving TFT and gate driving TFT is formed in such a manner that a gate metallic layer is formed on the gate insulation film 112, and then the gate metallic layer is patterned by the photolithographic process and the etching process.

In addition, the n+ impurities are respectively injected into the active layers 114 and 214 using the gate electrodes 106 and 206 of the respective pixel driving TFT and gate driving TFT as masks. Thus, the respective source areas 114S and 214S and the respective drain areas 114D and 214D of the active layers 114 and 214, which respectively do not overlap with the gate electrodes 106 and 206, face while the channel areas 114C and 214C, which overlap with the gate electrodes 106 and 206, are respectively interposed between the respective source areas 114S and 214S and the respective drain areas 114D and 214D.

Figure 3C:
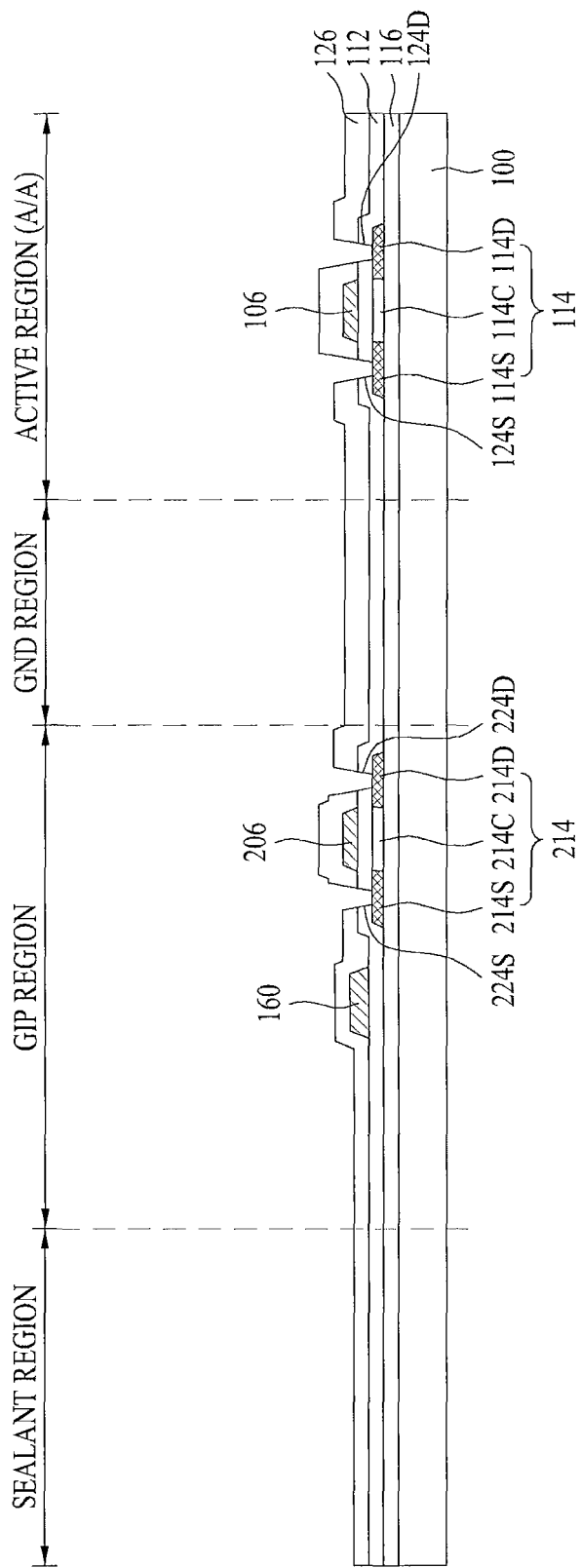

Referring to FIG. 3C, the layer insulation film 216 is formed on the gate insulation film 112 which is formed with the gate electrodes 106 and 206. The respective source contact holes 124S and 224S and the respective drain contact holes 124D and 224D of the pixel driving TFT and the gate driving TFT are formed so as to penetrate both the layer insulation film 126 and the gate insulation film 112.

In detail, the layer insulation film 126 is formed in such a manner that the inorganic insulation materials such as $SiO_2$ and the like are fully deposited on the gate insulation film 112 formed with the gate electrodes 106 and 206.

Subsequently, both the layer insulation film 126 and the gate insulation film 112 are penetrated by the photolithographic process and the etching process in order to form the source contact holes 124S and 224S and the drain contact holes 124D and 224D for exposing the respective source areas 114S and 2124S and the respective drain areas 114D and 214D of the active layers 114 and 214 of the respective pixel driving TFT and gate driving TFT.

Figure 3D:
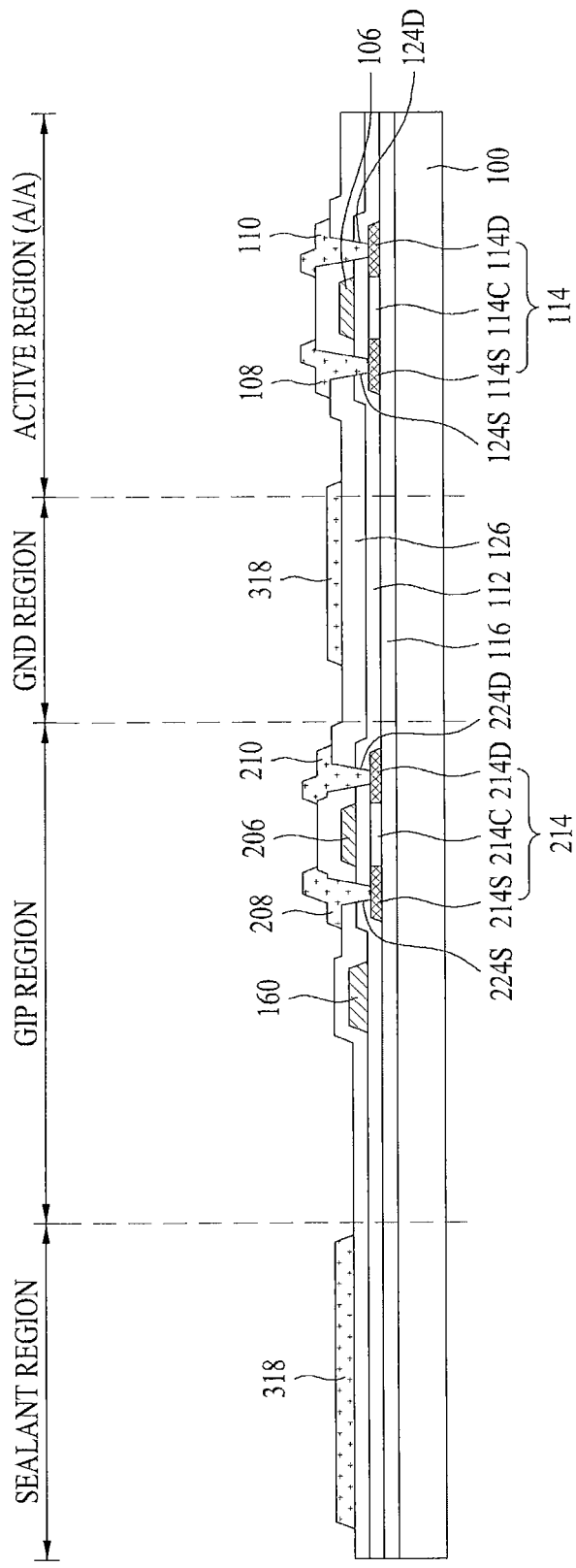

Referring to FIG. 3D, the layer insulation film 126 is formed with the respective source electrodes 108 and 208 and the respective drain electrodes 110 and 210 of the pixel driving TFT and the gate driving TFT, and the base voltage line 318.

In detail, the respective source electrodes 108 and 208 and the respective drain electrodes 110 and 210 of the pixel driving TFT and the gate driving TFT are formed in such a manner that source/drain metallic layers are formed on the layer insulation film 126, and then the source/drain metallic layers are patterned by the photolithographic process and the etching process. The respective source electrodes 108 and 208 and the respective drain electrodes 110 and 210 of the pixel driving TFT and the gate driving TFT are connected with the source areas 114S and 2124S and the drain areas 114D and 214D through the source contact holes 124S and 224S and the drain contact holes 124D and 224D, respectively.

Figure 3E:
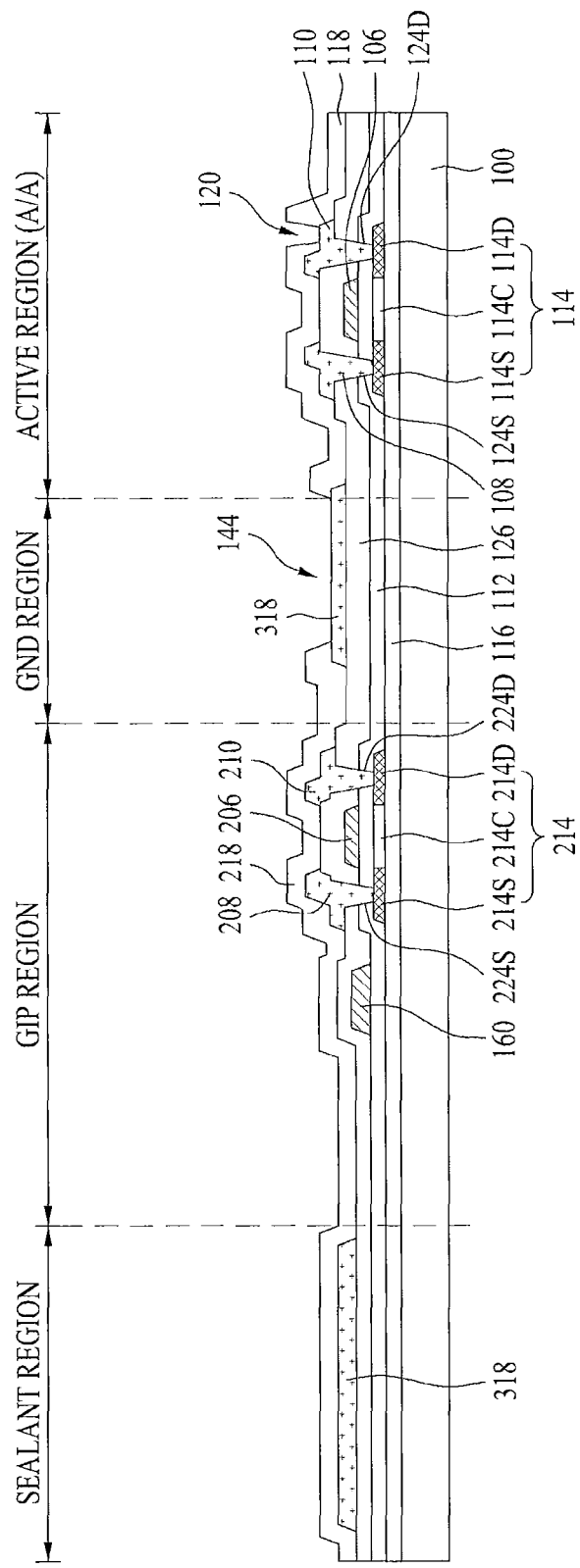

Referring to FIG. 3E, the first protective films 118 and 218 are formed on the layer insulation film 126 which is formed with the respective source electrodes 108 and 208 and the respective drain electrodes 110 and 210 of the pixel driving TFT and the gate driving TFT, and the base voltage line 318. The pixel contact hole 120 and the first contact hole 144 are formed so as to penetrate the first protective films 118 and 218, respectively.

In detail, the first protective films 118 and 218 are formed in such a manner that the inorganic insulation material is fully deposited on the layer insulation film 126 which is formed with the respective source electrodes 108 and 208 and the respective drain electrodes 110 and 210 of the pixel driving TFT and the gate driving TFT, and the base voltage line 318.

Subsequently, the pixel contact hole 120 and the first contact hole 144 are formed so as to penetrate the first protective films 118 and 218, respectively, through the photolithographic process and the etching process. The pixel contact hole 120 exposes the drain electrode 110 of the pixel driving TFT of the active region, whereas the first contact hole 144 exposes the base voltage line 318 of the GND region. The first contact hole 144 is provided between the first protective film 118 of the pixel driving TFT and the first protective film 218 of the gate driving TFT.

Figure 3F:
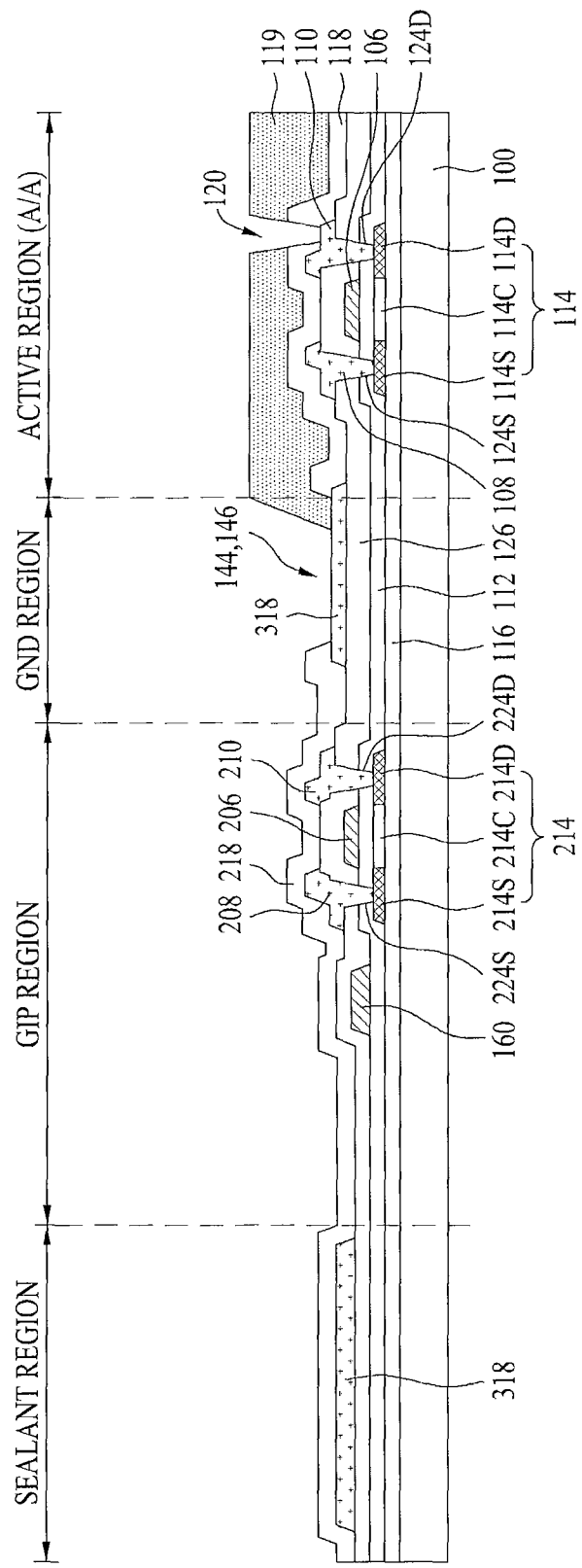

Referring to FIG. 3F, the second protective film 119 is formed on the lower substrate 100 which is formed with the first protective films 118 and 218. The pixel contact hole 120 and the second contact hole 146 are formed so as to penetrate the second protective film 119.

In detail, the second protective film 119 is made of the organic insulation material on the lower substrate 100 which is formed with the first protective films 118 and 218. For example, a photo-acrylic (PAC) material may be used as the organic insulation material.

Subsequently, the pixel contact hole 120 and the second contact hole 146 are formed so as to penetrate the second protective film 119 through the photolithographic process and the etching process. The pixel contact hole 120 exposes the drain electrode 110 of the pixel driving TFT of the active region, whereas the second contact hole 146 exposes the base voltage line 318 of the GND region. The second contact hole 146 is provided between the second protective film 119 of the pixel driving TFT and the first protective film 218 of the gate driving TFT. The second protective film 119 is removed from the GIP region, the GND region, and the sealant region, except for the active region.

Figure 3G:
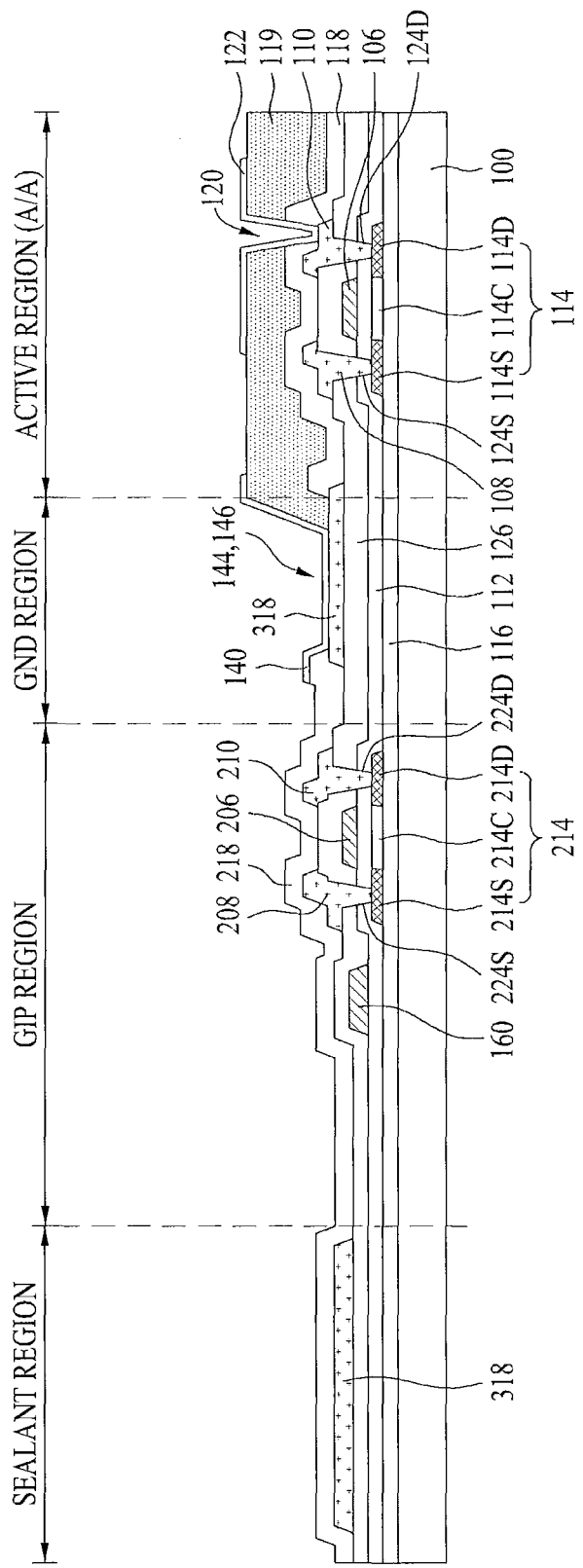

Referring to FIG. 3G, the anode 122 and the connection electrode 140 are formed on the lower substrate 100 which is formed with the second protective film 119.

In detail, the anode 122 and the connection electrode 140 are formed in such a manner that a transparent conductive film is deposited on the lower substrate 100 which is formed with the second protective film 119, and then the transparent conductive film is patterned by the photolithographic process and the etching process. The anode 122 is connected with the drain electrode 110 of the pixel driving TFT through the pixel contact hole 120, whereas the connection electrode 140 is connected with the base voltage line 318 through the first and second contact holes 144 and 146.

Referring to FIG. 3H, the bank insulation films 130 and 230 are formed on the lower substrate 100 which is formed with the anode 122 and the connection electrode 140. The bank hole 135 and the third contact hole 148 are formed so as to penetrate the bank insulation films 130 and 230, respectively.

In detail, the organic insulation material is fully applied on the lower substrate 100 which is formed with the anode 122 and the connection electrode 140 through a coating process such as spin coating, spinless coating, or the like. Subsequently, the bank insulation films 130 and 230 are respectively formed with the bank hole 135 for exposure of the anode 122 and the third contact hole 148 for exposure of the connection electrode 140 through the photolithographic process and the etching process. The third contact hole 148 is provided between the bank insulation film 130 formed on the pixel driving TFT and the bank insulation film 230 formed on the gate driving TFT. Thus, the GND region is formed with the out-gassing blocking holes composed of the first, second, and third contact holes 144, 146, and 148.

Figure 3I:
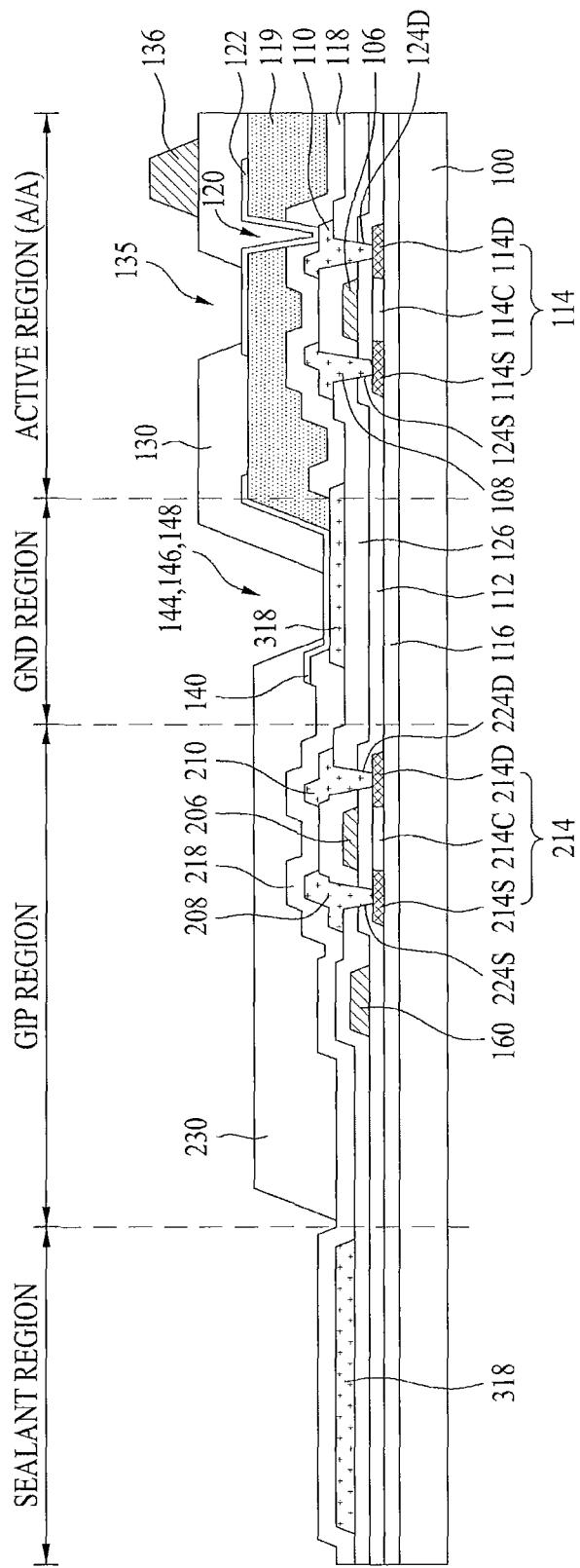

Referring to FIG. 3I, the spacer 136 is formed on the lower substrate 100 formed with the bank insulation films 130 and 230 which respectively include the bank hole 135 and the third contact hole 148.

In detail, the organic insulation material is fully applied on the bank insulation films 130 and 230 which respectively include the bank hole 135 and the third contact hole 148 through the coating process such as spin coating, spinless coating, or the like. Subsequently, the photolithographic process and the etching process allow the spacer 136 having a tapered shape to be formed from the organic insulation material.

Figure 3J:
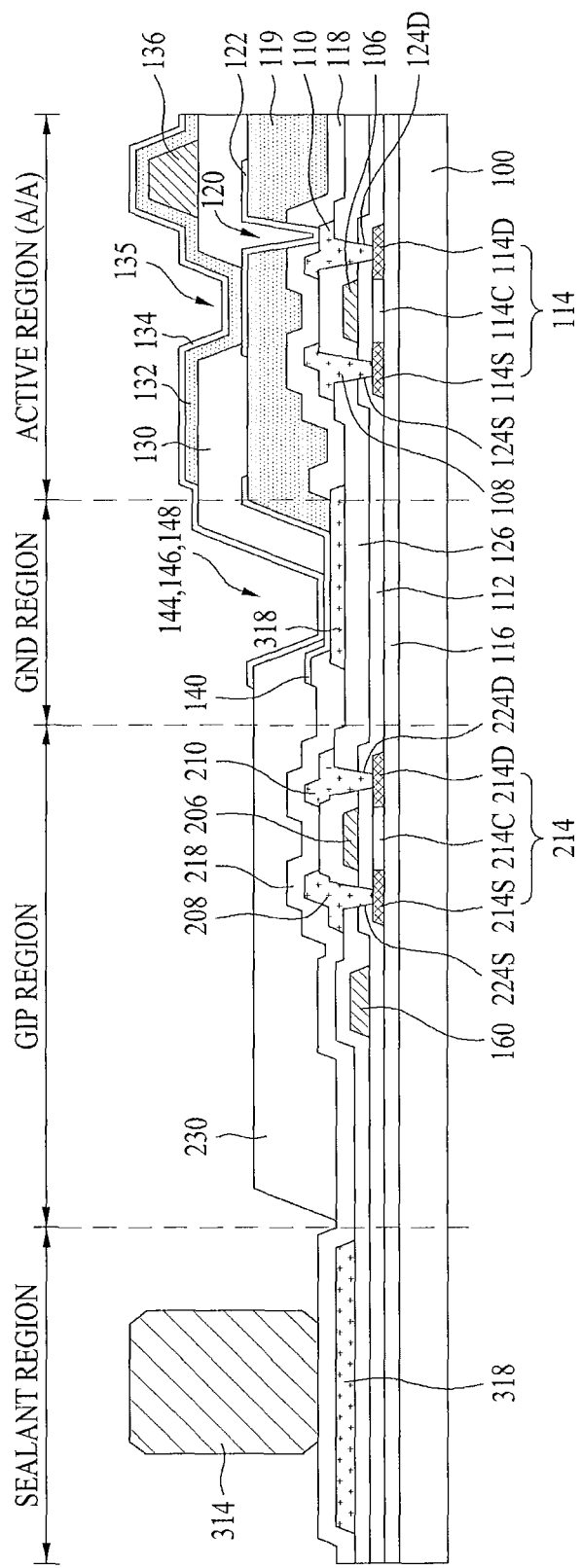

Referring to FIG. 3J, the organic layer 132 and the cathode 134 are sequentially formed on the bank insulation film 130 which is formed with the spacer 136.

In detail, the organic layer 132 sequentially composed of the positive hole injection layer, the positive hole transport layer, the luminescent layer, and the electron transport layer is formed on the bank insulation film 130 which is formed with the bank hole 135. Thereafter, the cathode 134 is formed on the lower substrate 100 which is formed with the organic layer 132 while being connected with the connection electrode 140 through the third contact hole 148.

Figure 3K:
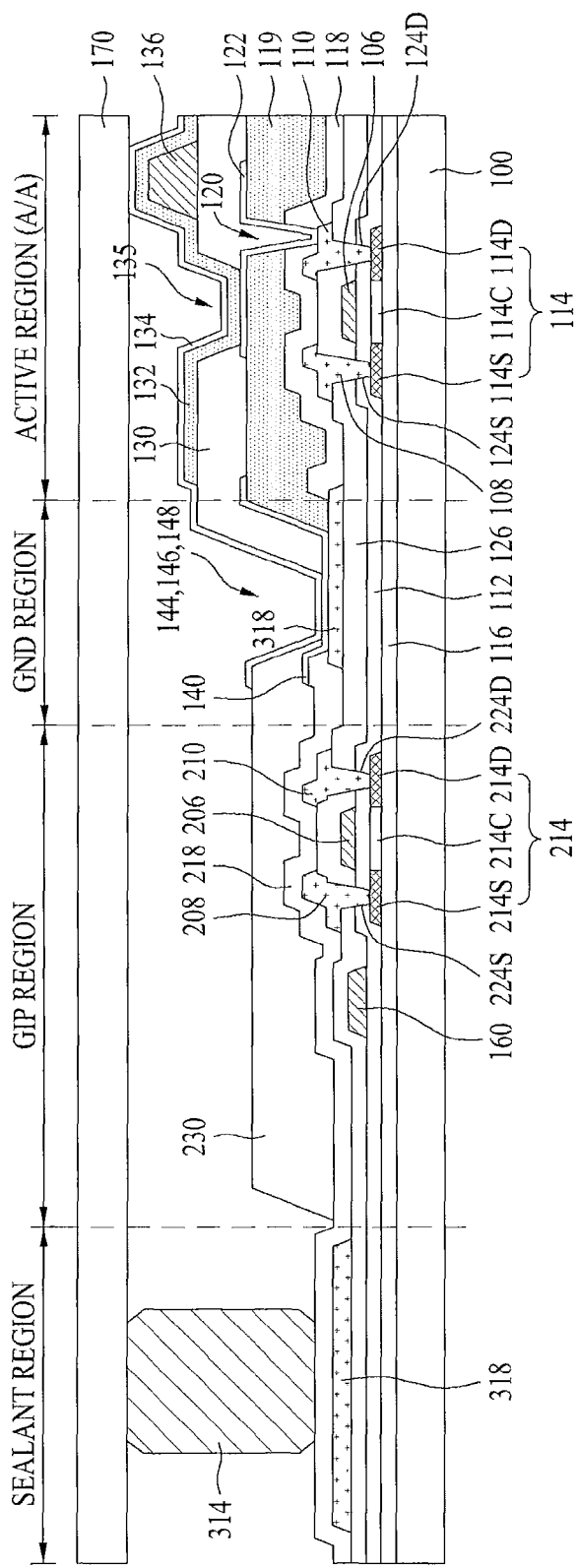

Referring to FIG. 3K, the lower substrate 100 illustrated in FIGS. 3A to 3J is attached to the upper substrate 170. The upper substrate 170 may be formed in a glass encapsulation manner. The upper and lower substrates 170 and 100 are attached using a frit sealing process.

Figure 4:
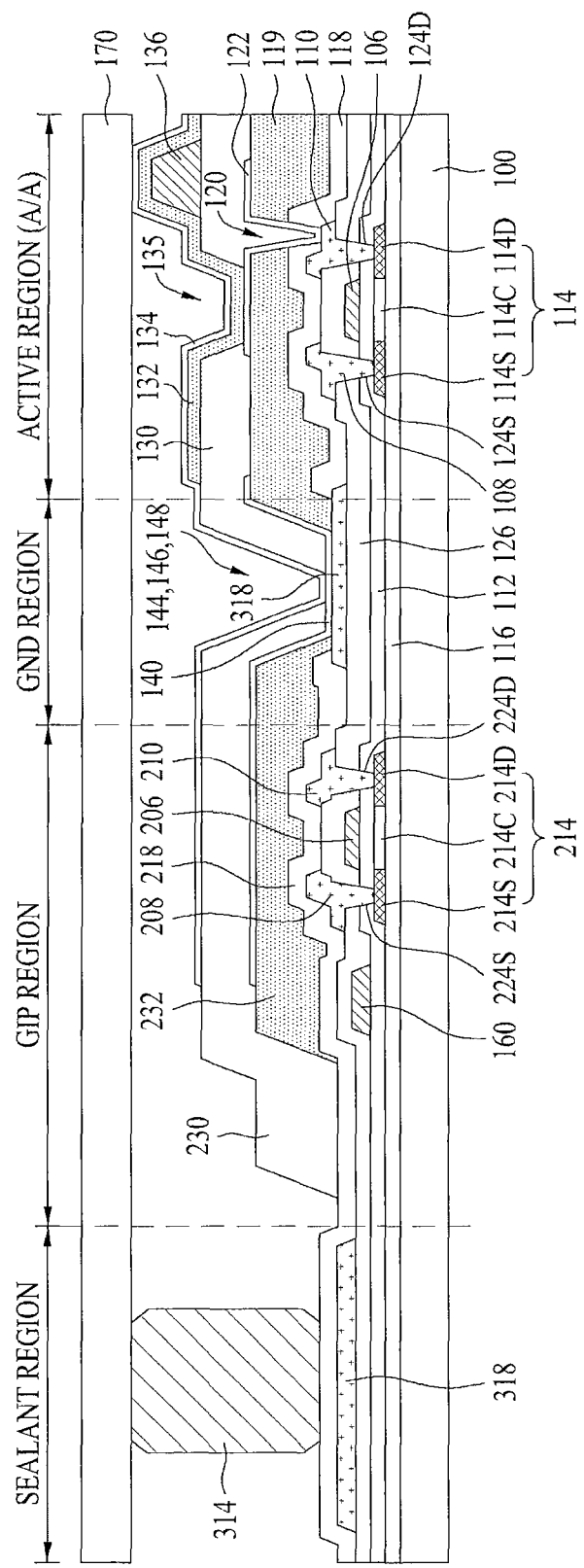
FIG. 4 is a sectional view illustrating an organic light emitting display device according to a second embodiment of the present invention.

FIG. 4 is a sectional view illustrating an organic light emitting display device according to a second embodiment of the present invention.

The organic light emitting display device according to the second embodiment of the present invention includes an organic light emitting display panel equipped with an active region 300 or A/A for displaying an image and a gate driver 312 for driving gate lines GL1 to GLn of the active region 300 or A/A, and a data driver 310 for driving data lines DL1 to DLn of the active region 300 or A/A, as shown in FIG. 1.

The organic light emitting display panel has an upper substrate 170 and a lower substrate 100, which face and are attached to each other. The organic light emitting display panel includes an active region 300 or A/A which includes gate lines GL1 to GLn, data lines DL1 to DLn, power lines PL1 to PLn, and a plurality of pixel areas 320 connected with a base voltage line 318, a GIP region formed with the gate driver 312 for driving the gate lines GL1 to GLn, a GND region formed between the GIP region and the active region to be formed with the base voltage line 318 for supplying base voltage GND to the active region, and a sealant region formed with a sealant 314 for attaching the upper substrate 170 to the lower substrate 100. Each of the plural pixel areas 320 has a pixel switching TFT ST connected with one gate line GL and one data line DL, a pixel driving TFT DT connected with one power line PL and an anode of a corresponding one of the organic luminescent elements, and a storage capacitor C connected between the power line PL and a drain electrode of the pixel switching TFT ST.

In this case, since the organic light emitting display device according to the second embodiment of the present invention, as shown in FIG. 4, has the same configuration as the pixel driving TFT and the gate driving TFT of the organic light emitting display device according to the first embodiment of the present invention, no description will be given thereof.

The GIP region of the organic light emitting display device according to the second embodiment of the present invention includes first and second protective films 218 and 232 which cover the gate driving TFT, and a bank insulation film 230. The first protective film 218 may be made of an inorganic insulation material, whereas the second protective film 232 may be made of an organic insulation material. The bank insulation film 230 may be made of a polyimide (PI) material that exhibits low out-gassing. The second protective film 232 is provided in order to widely form a connection electrode 140 and a cathode 134 connected with the base voltage line 318 up to the GIP region. Therefore, the connection electrode 140 and the cathode 134 are widely formed up to the GIP region, thereby enabling resistance reduction.

The GND region is formed between the GIP region and the active region. The GND region includes the base voltage line 318 for supplying the base voltage to a cathode 134 of each organic luminescent element, and out-gassing blocking holes 144, 146, and 148 for blocking out-gassing occurring from the sealant 314 and a plurality of protective films of the GIP region.

The out-gassing blocking holes 144, 146, and 148 are comprised of a first contact hole 144 which is formed between the first protective film 118 formed on the pixel driving TFT and the first protective film 218 formed on the gate driving TFT, a second contact hole 146 which is formed between the second protective film 119 formed on the pixel driving TFT and the second protective film 232 formed on the gate driving TFT, and a third contact hole 148 which is formed between the bank insulation film 130 on the pixel driving TFT and the bank insulation film 230 formed on the gate driving TFT.

The out-gassing occurs from the first and second protective films 218 and 232 formed on each of a plurality of gate driving TFTs of the GIP region and the organic insulation material of the sealant 314, such that such out-gassing may infiltrate into an organic layer 132 of the organic luminescent element. However, the present invention may prevent movement of the out-gassing occurring from the material of the sealant or a plurality of protective films of the GIP region by the out-gassing blocking holes 144, 146, and 148 composed of the plural contact holes between the respective protective films formed on the gate driving TFT of the GIP region and the respective protective films formed on the pixel driving TFT.

In particular, each of the second protective film 232 formed on the gate driving TFT and the second protective film 119 formed on the pixel driving TFT is generally made of a photo-acrylic (PAC) material. Generally, the photo-acrylic (PAC) and polyimide (PI) materials are used as the organic insulation materials. Herein, the polyimide (PI) material exhibits low out-gassing, but is ten times or more expensive, as compared to the photo-acrylic (PAC) material. Therefore, the polyimide (PI) material is used for the bank insulation film 130 which directly comes into contact with the organic layer 132, whereas the photo-acrylic (PAC) material is greatly used on the TFTs due to cost.

However, although the second protective film 232 formed at the GIP region is made of the photo-acrylic material, the out-gassing occurring from the plural protective films formed at the GIP region may be blocked by the out-gassing blocking holes 144, 146, and 148.

Accordingly, in accordance with the present invention, the second protective film 232 is formed on the gate driving TFT so that the connection electrode 140 and the cathode 134 is widely formed up to the GIP region while being made of the photo-acrylic material in the GIP region to maintain costs. As a result, the present invention has an effect of achieving improved reduction of resistance at the same cost.

FIGS. 5A to 5K are sectional views illustrating a method for manufacturing the organic light emitting display device shown in FIG. 4 according to the second embodiment of the present invention.

In the method for manufacturing the organic light emitting display device shown in FIGS. 5A to 5D according to the second embodiment of the present invention, since a fabrication process of the pixel driving TFT formed at the active region, a fabrication process of the gate driving TFT formed at the GIP region, and a formation process of the first protective film are the same as the method for manufacturing the organic light emitting display device shown in FIGS. 3A to 3D according to the second embodiment of the present invention, no description will be given thereof.

Referring to FIG. 5E, the first protective films 118 and 218 are formed on the layer insulation film 126 which is formed with the respective source electrodes 108 and 208 and the respective drain electrodes 110 and 210 of the pixel driving TFT and the gate driving TFT, and the base voltage line 318. The pixel contact hole 120 and the first contact hole 144 are formed so as to penetrate the first protective films 118 and 218, respectively.

In detail, the first protective films 118 and 218 are formed in such a manner that the inorganic insulation material is fully deposited on the layer insulation film 126 which is formed with the respective source electrodes 108 and 208 and the respective drain electrodes 110 and 210 of the pixel driving TFT and the gate driving TFT, and the base voltage line 318.

Subsequently, the pixel contact hole 120 and the first contact hole 144 are formed so as to penetrate the first protective films 118 and 218, respectively, through the photolithographic process and the etching process. The pixel contact hole 120 exposes the drain electrode 110 of the pixel driving TFT of the active region, whereas the first contact hole 144 exposes the base voltage line 318 of the GND region. The first contact hole 144 is provided between the first protective film 118 of the pixel driving TFT and the first protective film 218 of the gate driving TFT.

Figure 5A:
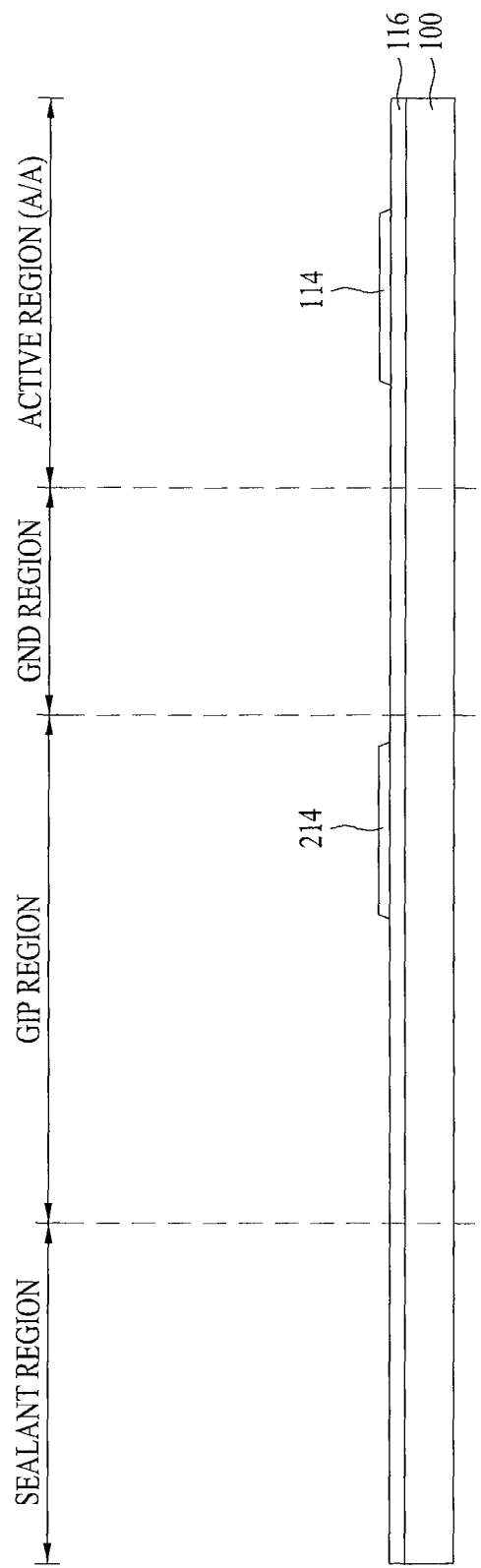
Figure 5B:
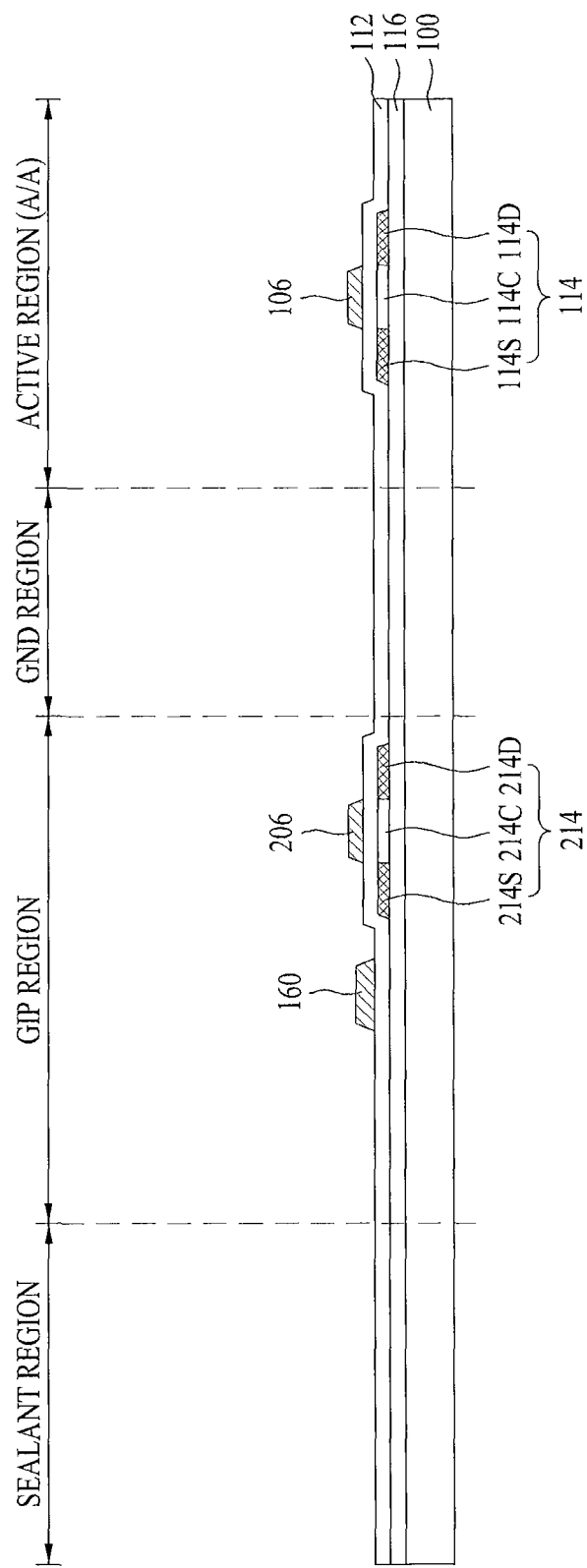
Figure 5C:
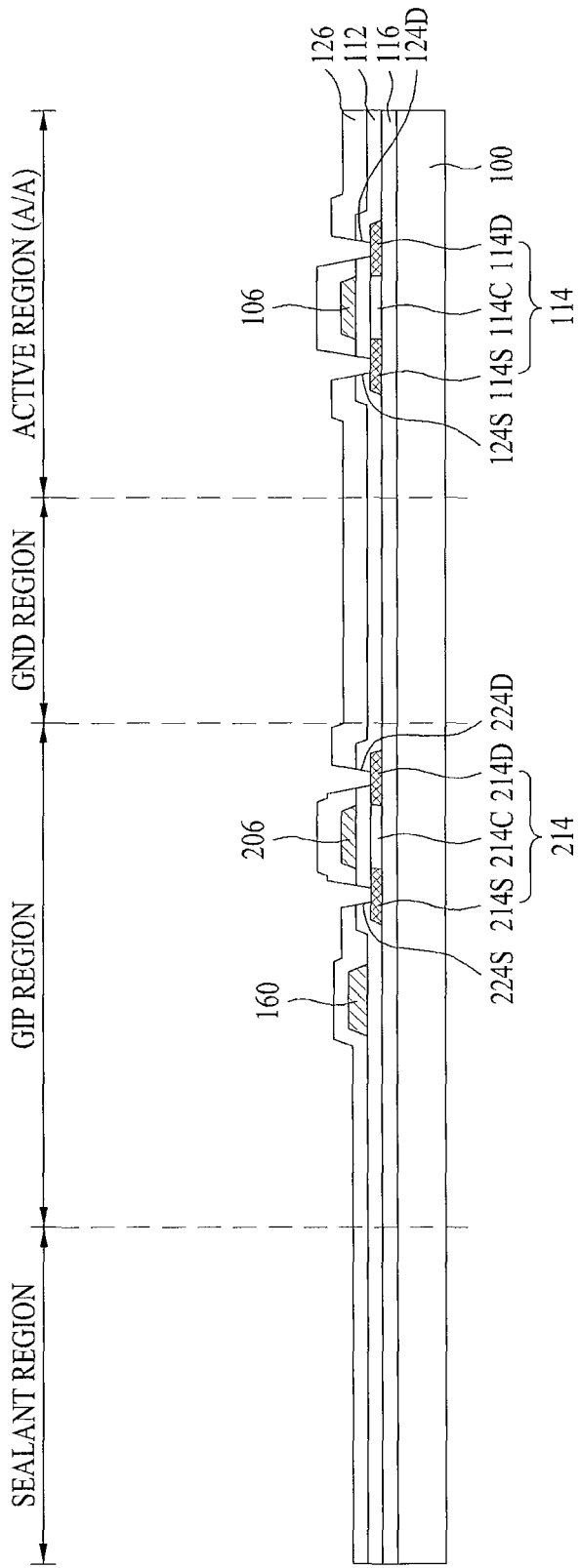
Figure 5D:
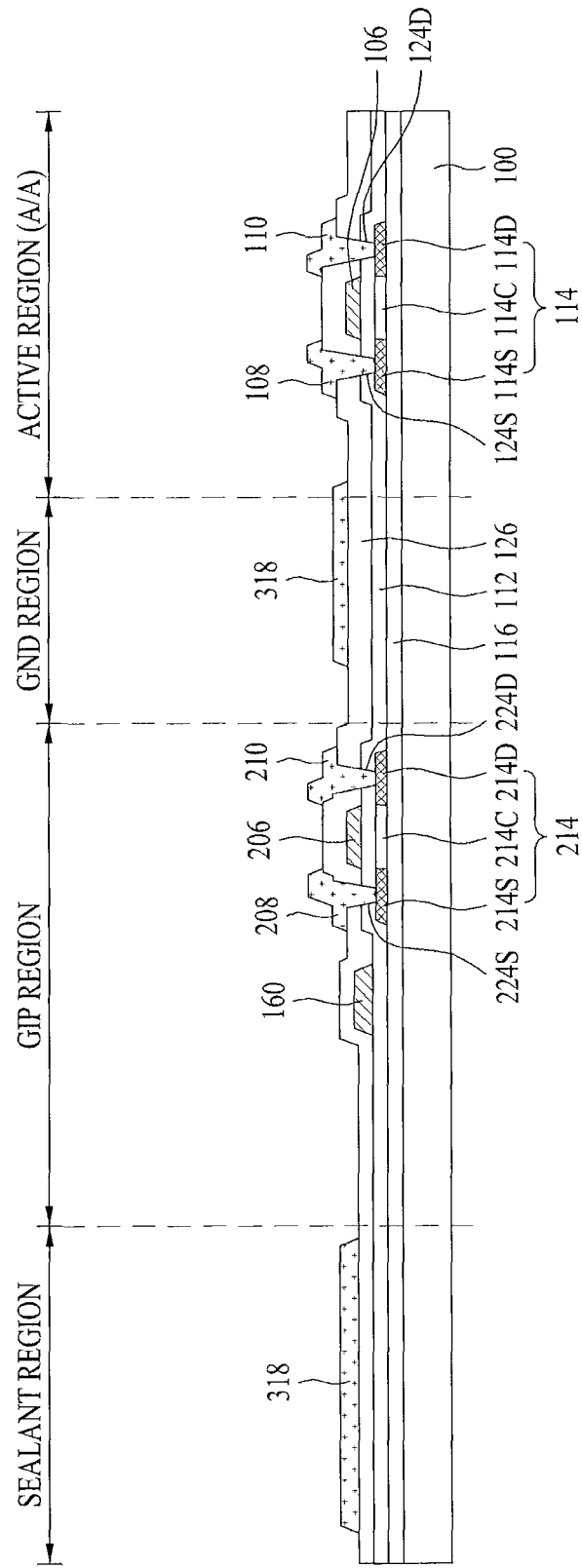
Figure 5F:
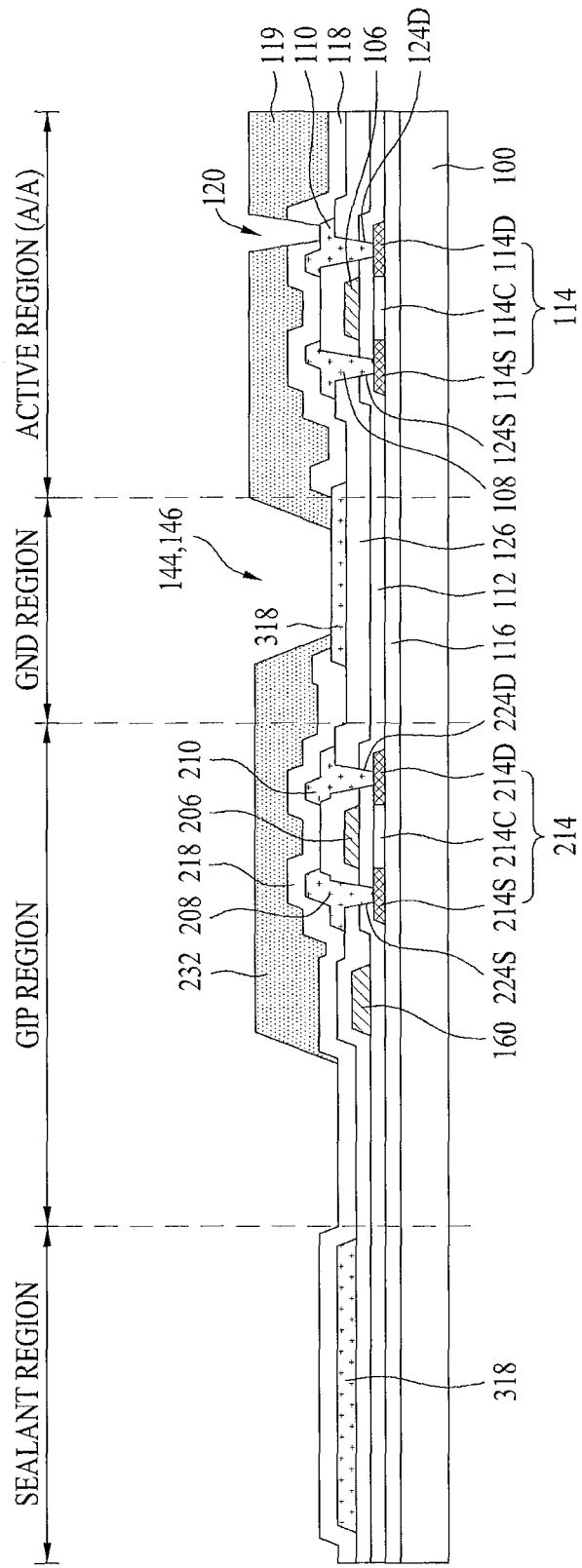

Referring to FIG. 5F, the second protective films 119 and 232 are formed on the pixel driving TFT and the gate driving TFT which are formed with the first protective films 118 and 218, respectively. The pixel contact hole 120 which penetrates the second protective film 119, and the second contact hole 146 for exposure of the base voltage line 318 are formed.

In detail, each of the second protective films 119 and 232 is made of the organic insulation material on the lower substrate 100 which is formed with the first protective films 118 and 218. For example, a photo-acrylic (PAC) material may be used as the organic insulation material.

Subsequently, the pixel contact hole 120 and the second contact hole 146 are formed so as to penetrate the second protective films 119 and 232, respectively, through the photolithographic process and the etching process. The pixel contact hole 120 exposes the drain electrode 110 of the pixel driving TFT of the active region, whereas the second contact hole 146 exposes the base voltage line 318 of the GND region. Accordingly, the second contact hole 146 is provided between the second protective film 119 of the pixel driving TFT and the second protective film 232 of the gate driving TFT.

Figure 5G:
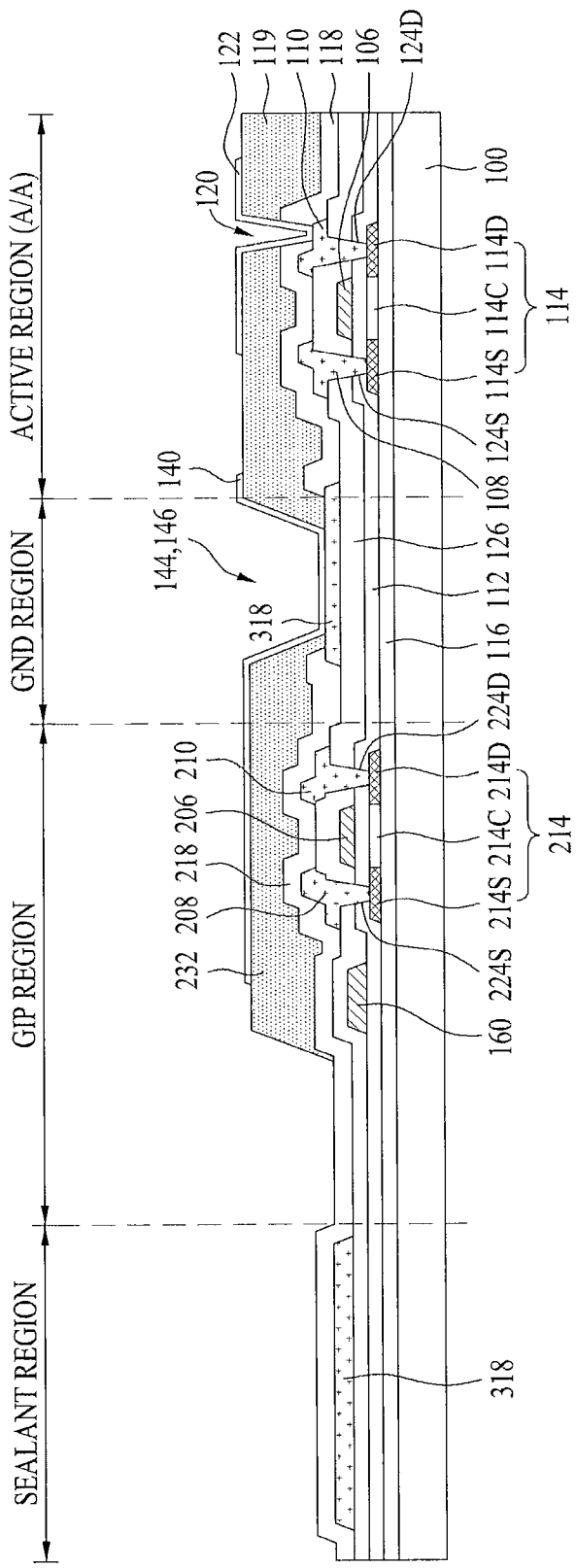

Referring to FIG. 5G, the anode 122 and the connection electrode 140 are formed on the lower substrate 100 which is formed with the second protective films 119 and 232.

In detail, the anode 122 and the connection electrode 140 are formed in such a manner that a transparent conductive film is deposited on the lower substrate 100 which is formed with the second protective films 119 and 232, and then the transparent conductive film is patterned by the photolithographic process and the etching process. The anode 122 is connected with the drain electrode 110 of the pixel driving TFT through the pixel contact hole 120, whereas the connection electrode 140 is connected with the base voltage line 318 through the first and second contact holes 144 and 146. In this case, the connection electrode 140 is widely formed up to the GIP region to be formed on the second protective film 232 of the gate driving TFT.

Figure 5H:
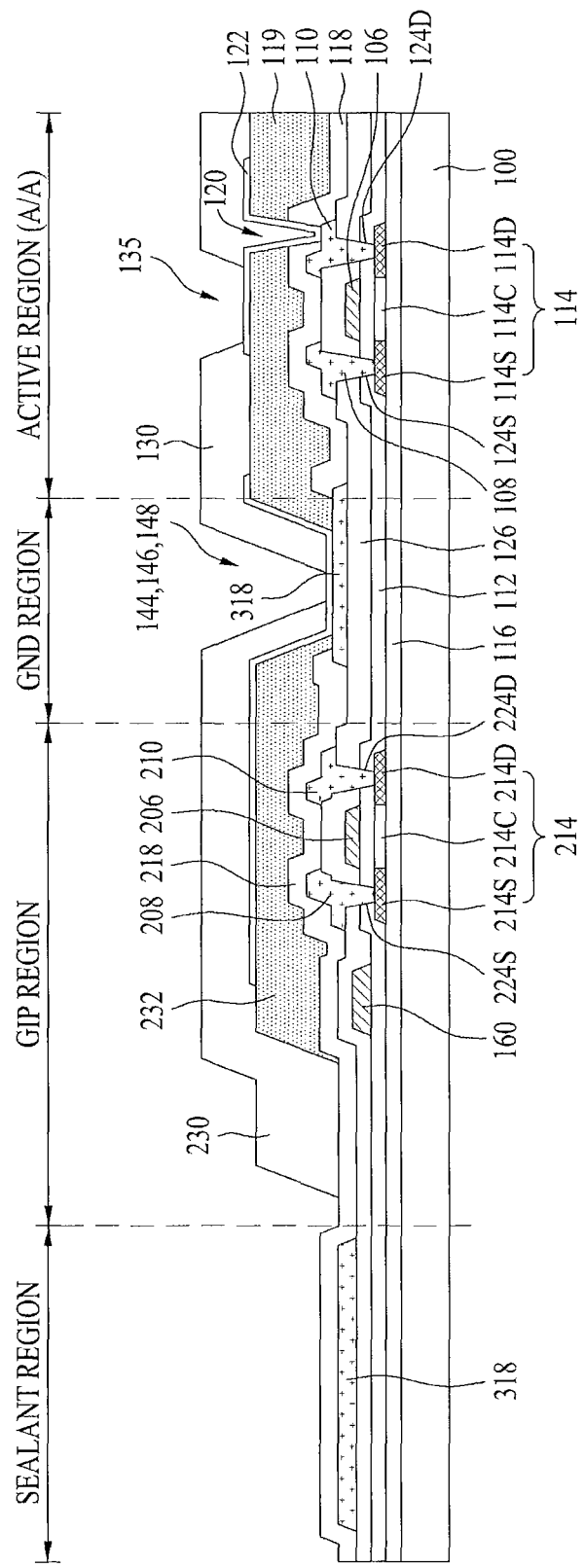

Referring to FIG. 5H, the bank insulation films 130 and 230 are formed on the lower substrate 100 which is formed with the anode 122 and the connection electrode 140. The bank hole 135 which penetrates the bank insulation films 130, and the third contact hole 148 for exposure of the connection electrode 140 are formed.

In detail, the organic insulation material is fully applied on the lower substrate 100 which is formed with the anode 122 and the connection electrode 140 through a coating process such as spin coating, spinless coating, or the like. Subsequently, the photolithographic process and the etching process allow the bank hole 135 for exposure of the anode 122 and the third contact hole 148 for exposure of the connection electrode 140 to be formed from the organic insulation material. Accordingly, the third contact hole 148 is provided between the bank insulation film 130 formed on the pixel driving TFT and the bank insulation film 230 formed on the gate driving TFT. Thus, the out-gassing blocking holes composed of the first, second, and third contact holes 144, 146, and 148 are formed.

Referring to FIG. 5I, the spacer 136 is formed on the lower substrate 100 which is formed with the bank insulation films 130 and 230.

In detail, the organic insulation material is fully applied on the bank insulation films 130 and 230 which respectively include the bank hole 135 and the third contact hole 148 through the coating process such as spin coating, spinless coating, or the like. Subsequently, the photolithographic process and the etching process allow the spacer 136 having the tapered shape to be formed from the organic insulation material.

Figure 5J:
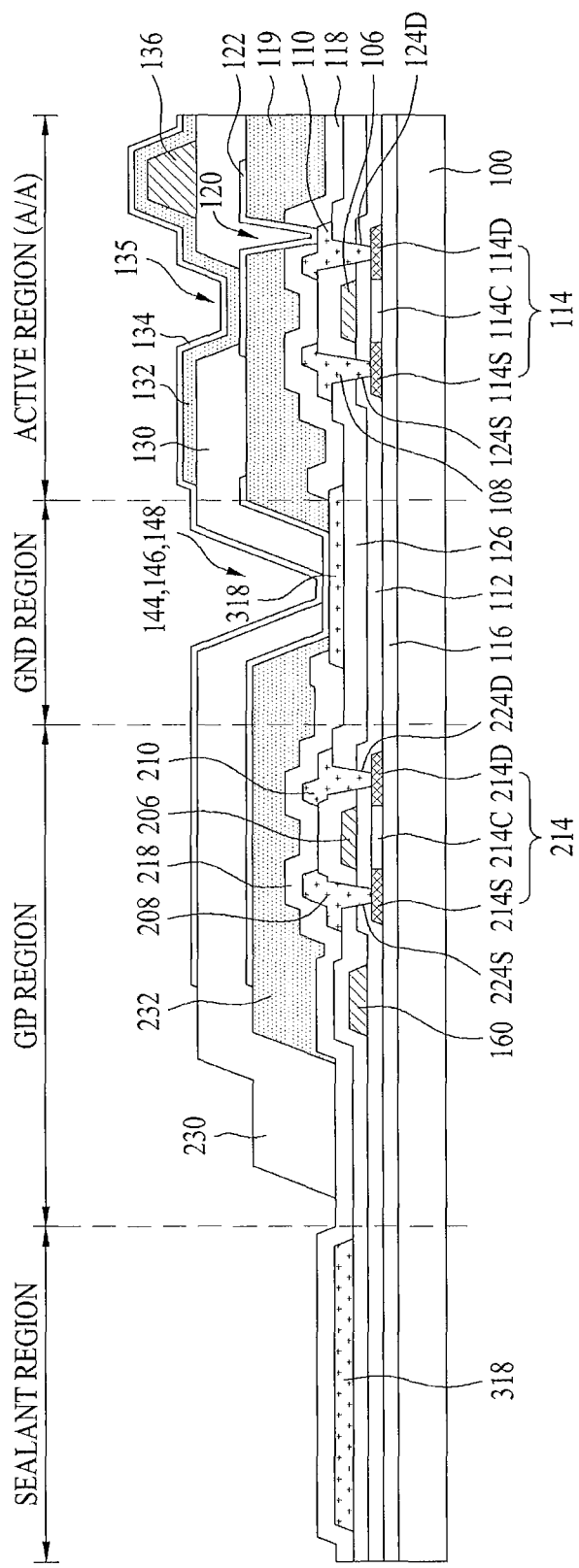

Referring to FIG. 5J, the organic layer 132 and the cathode 134 are sequentially formed on the lower substrate 100 which is formed with the spacer 136.

In detail, the organic layer 132 sequentially composed of the positive hole injection layer, the positive hole transport layer, the luminescent layer, and the electron transport layer is formed on the lower substrate 100 which is formed with the spacer 136. Thereafter, the cathode 134 is widely formed up to the GIP region on the lower substrate 100 which is formed with the organic layer 132 while being connected with the connection electrode 140 through the third contact hole 148.

Figure 5K:
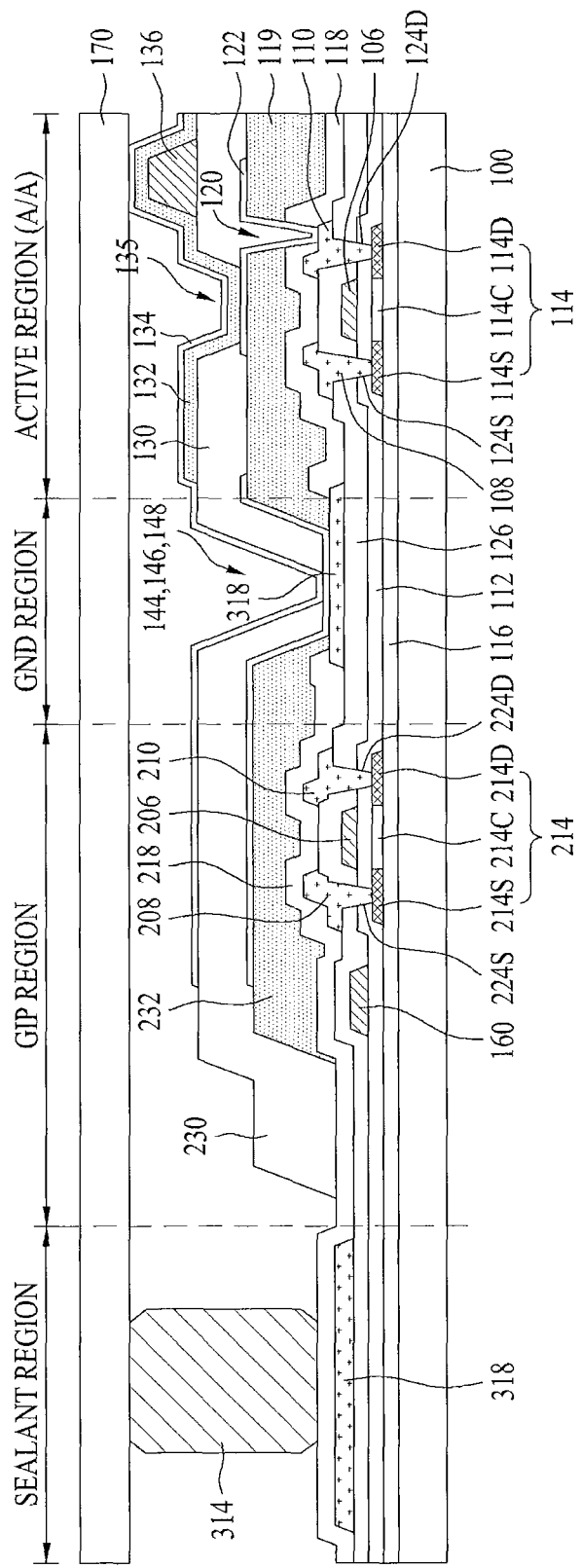

Referring to FIG. 5K, the lower substrate 100 illustrated in FIGS. 5A to 5J is attached to the upper substrate 170. The upper substrate 170 may be formed in a glass encapsulation manner. The upper and lower substrates 170 and 100 are attached using a frit sealing process.

Figure 6:
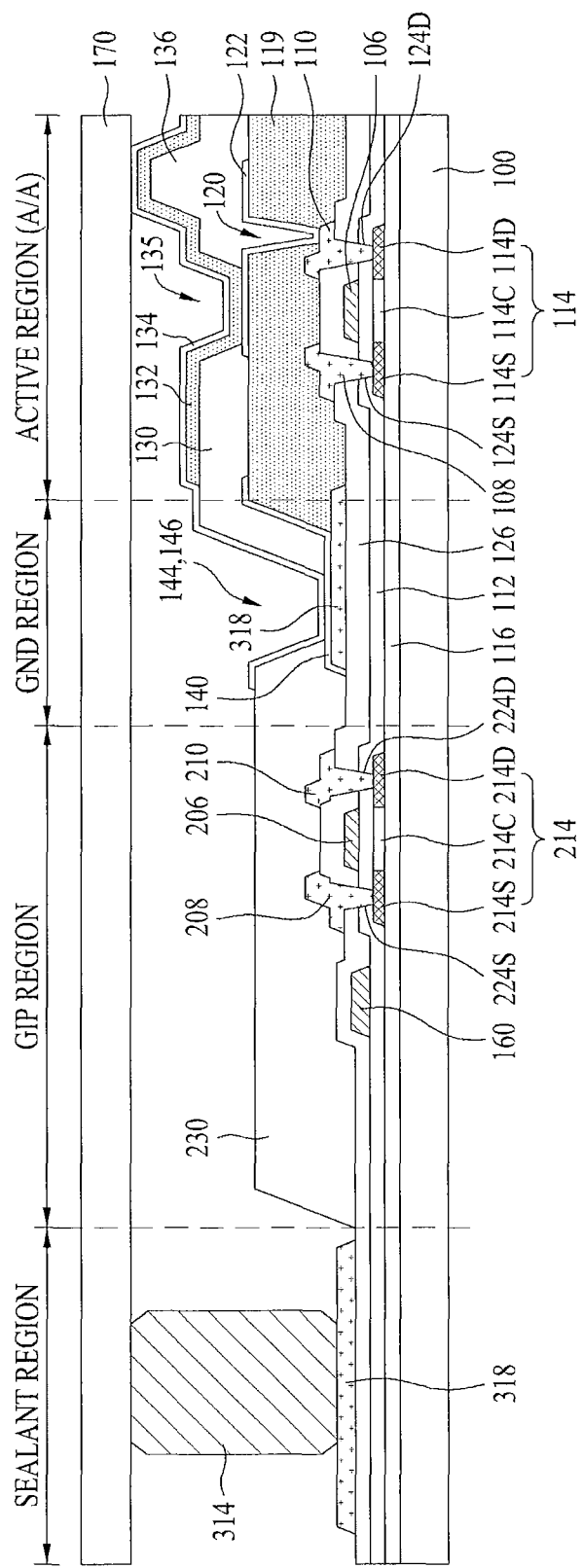
FIG. 6 is a sectional view illustrating an organic light emitting display device according to a third embodiment of the present invention.

FIG. 6 is a sectional view illustrating an organic light emitting display device according to a third embodiment of the present invention.

The organic light emitting display device according to the third embodiment of the present invention includes an organic light emitting display panel equipped with an active region 300 or A/A for displaying an image and a gate driver 312 for driving gate lines GL1 to GLn of the active region 300 or A/A, and a data driver 310 for driving data lines DL1 to DLn of the active region 300 or A/A, as shown in FIG. 1.

The organic light emitting display panel has an upper substrate 170 and a lower substrate 100, which face and are attached to each other. The organic light emitting display panel includes an active region 300 or A/A which includes gate lines GL1 to GLn, data lines DL1 to DLn, power lines PL1 to PLn, and a plurality of pixel areas 320 connected with a base voltage line 318, a GIP region formed with the gate driver 312 for driving the gate lines GL1 to GLn, a GND region formed between the GIP region and the active region to be formed with the base voltage line 318 for supplying base voltage GND to the active region, and a sealant region formed with a sealant 314 for attaching the upper substrate 170 to the lower substrate 100. Each of the plural pixel areas 320 has a pixel switching TFT ST connected with one gate line GL and one data line DL, a pixel driving TFT DT connected with one power line PL and an anode of a corresponding one of the organic luminescent elements, and a storage capacitor C connected between the power line PL and a drain electrode of the pixel switching TFT ST.

In this case, since the organic light emitting display device according to the third embodiment of the present invention, as shown in FIG. 6, has the same configurations as those of the pixel driving TFT and the gate driving TFT of the organic light emitting display device according to the first embodiment of the present invention, no description will be given thereof.

The active region of the organic light emitting display device according to the third embodiment of the present invention includes pixel driving TFTs, a protective film 119 made of an organic insulation material while being formed with a pixel contact hole 120 on each of the pixel driving TFTs, an organic luminescent element connected with a drain electrode 110 of each pixel driving TFT. The organic luminescent element includes an anode 122 connected with the drain electrode 110 of the pixel driving TFT, a bank insulation film 130 formed with a bank hole 135 for exposure of the anode 122 and a spacer 136 for maintenance of a cell gap, an organic layer 132 formed on the anode 122 exposed through the bank hole 135, and a cathode 134 formed on the organic layer 132. As shown in FIG. 6, the bank insulation film 130 and the spacer 136 are simultaneously formed of the same material.

The GIP region is formed with the gate driver 312 which includes a plurality of gate driving TFTs for driving the gate lines GL1 to GLn. The GIP region is located adjacent to the sealant region. The GIP region includes the gate driving TFTs and a bank insulation film 230 formed on each of the gate driving TFTs. The bank insulation film 230 may be made of a polyimide material that exhibits low out-gassing.

The GND region is formed between the GIP region and the active region. The GND region includes the base voltage line 318 for supplying the base voltage to the cathode 134 of the organic luminescent element, and out-gassing blocking holes 144 and 146 for blocking out-gassing occurring from the sealant 314 and the GIP region.

The out-gassing blocking holes 144 and 146 are comprised of a first contact hole 144 which is formed between the protective film 119 formed on the pixel driving TFT and the bank insulation film 230 formed on the gate driving TFT, and a second contact hole 146 which is formed between the bank insulation film 130 formed on the pixel driving TFT and the bank insulation film 230 formed on the gate driving TFT. Thus, the out-gassing occurring from the material of the sealant or a plurality of protective films formed on each of the plural gate driving TFTs of the GIP region is blocked so as not to move from the GIP region by the out-gassing blocking holes 144 and 146. Furthermore, since a photo-acrylic material that exhibits high out-gassing is not formed at the GIP region as an organic protective film, the probability of the out-gassing from the GIP region can occur.

In addition, the organic light emitting display device according to the third embodiment of the present invention includes the protective film made of the only organic insulation material, instead of the first protective films made of the inorganic insulation materials in the organic light emitting display device according to the first embodiment of the present invention.

The base voltage line 318 is formed on the layer insulation film 126 to supply the base voltage to the cathode 134 of the organic luminescent element through a connection electrode 140. The connection electrode 140 is connected with the base voltage line 318 through the first contact hole 144 while being connected with the cathode 134 through the second contact hole 146.

FIGS. 7A to 7I are sectional views illustrating a method for manufacturing the organic light emitting display device shown in FIG. 6 according to the third embodiment of the present invention.

In the method for manufacturing the organic light emitting display device shown in FIGS. 7A to 7D according to the third embodiment of the present invention, since a fabrication process of the pixel driving TFT formed at the active region and a fabrication process of the gate driving TFT formed at the GIP region are the same as the method for manufacturing the organic light emitting display device shown in FIGS. 3A to 3D according to the second embodiment of the present invention, no description will be given thereof.

Figure 7A:
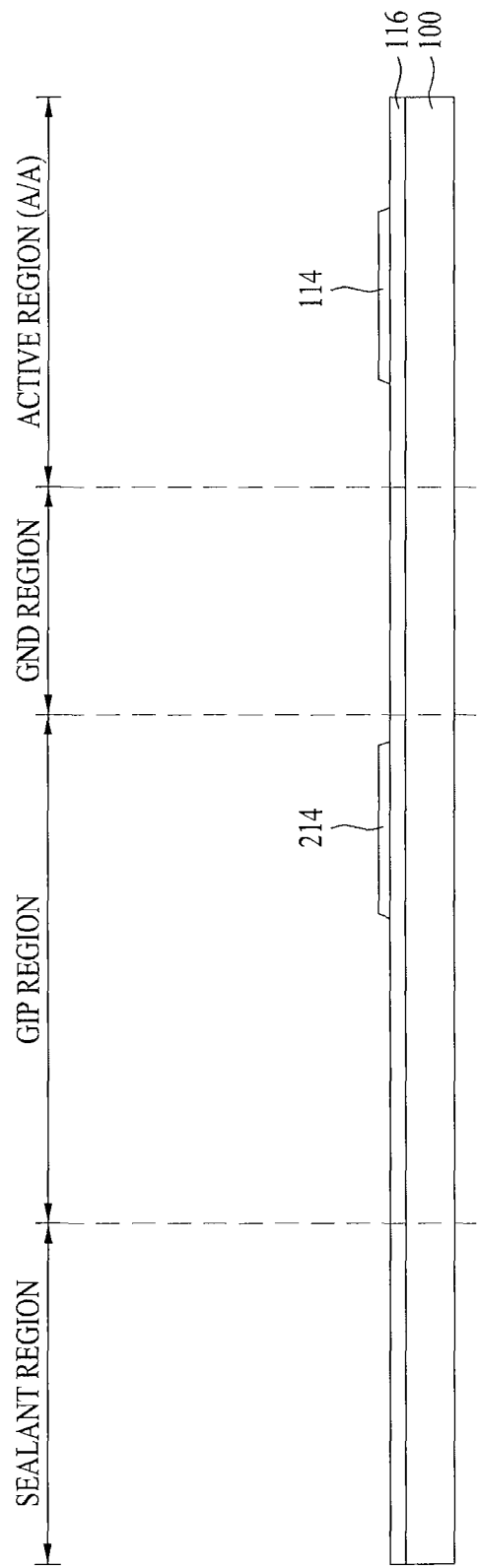
FIGS. 7A to 7I are sectional views illustrating a method for manufacturing the organic light emitting display device shown in FIG. 6 according to the third embodiment of the present invention.
Figure 7B:
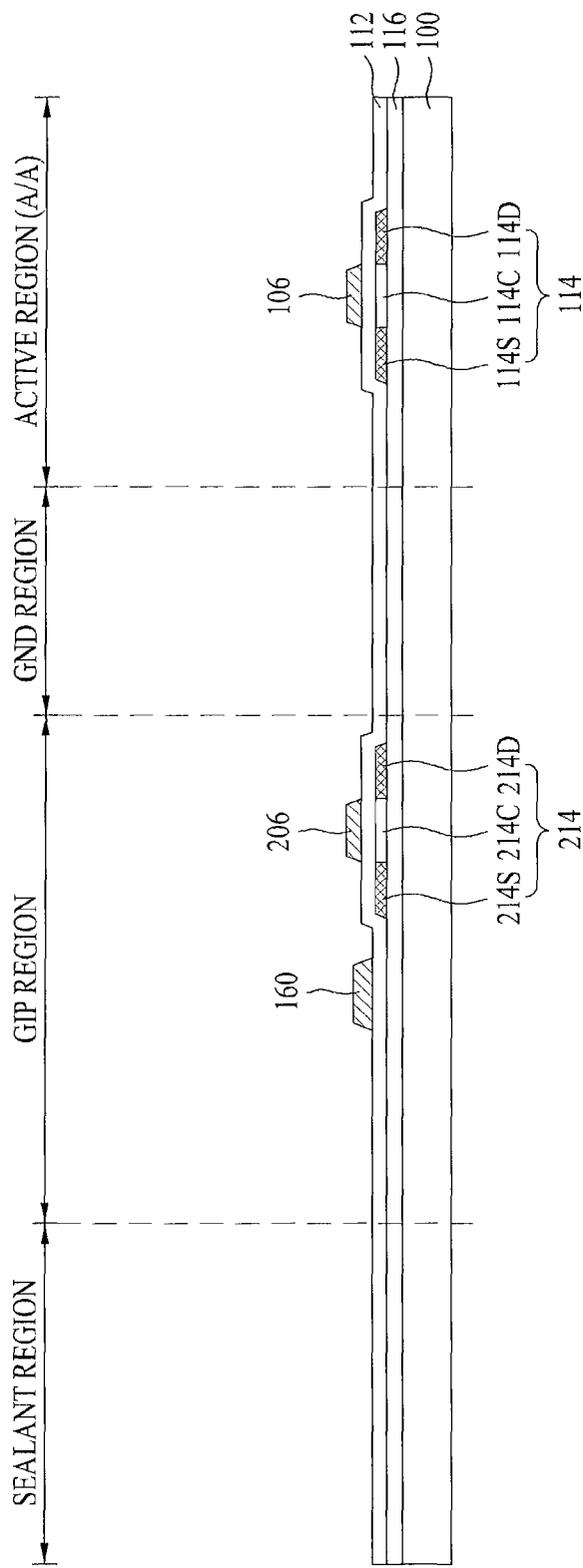
Figure 7C:
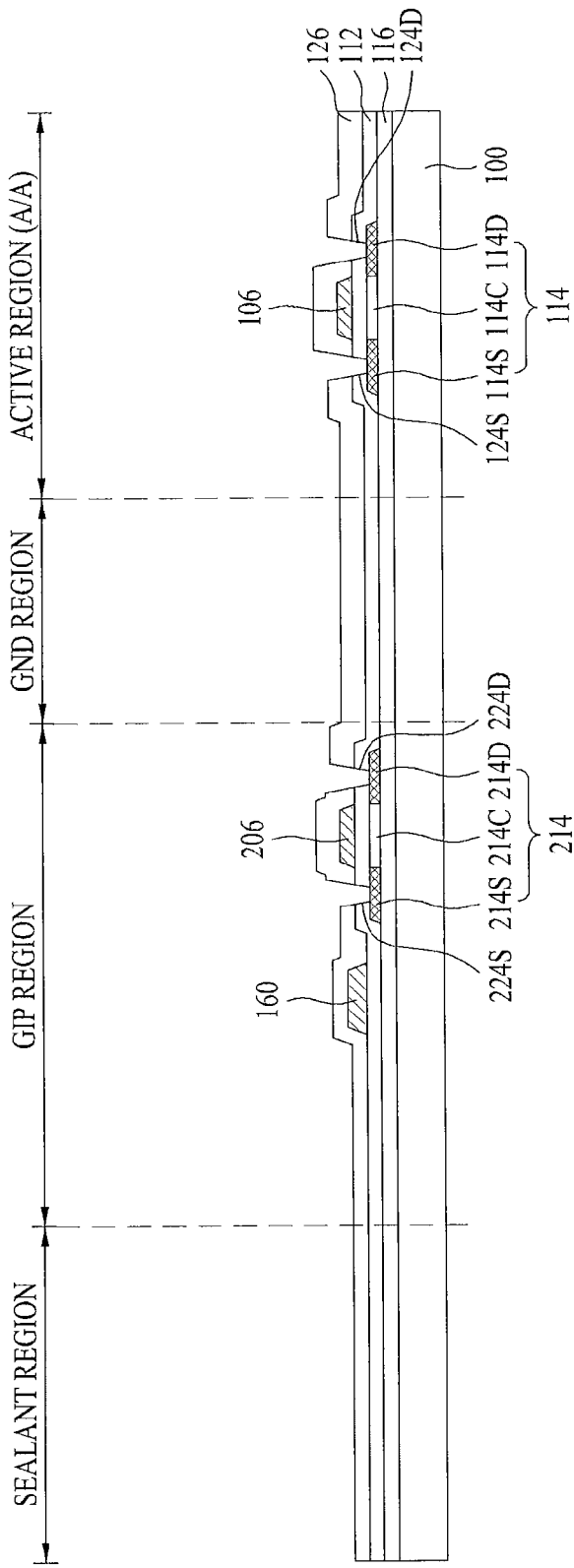
Figure 7D:
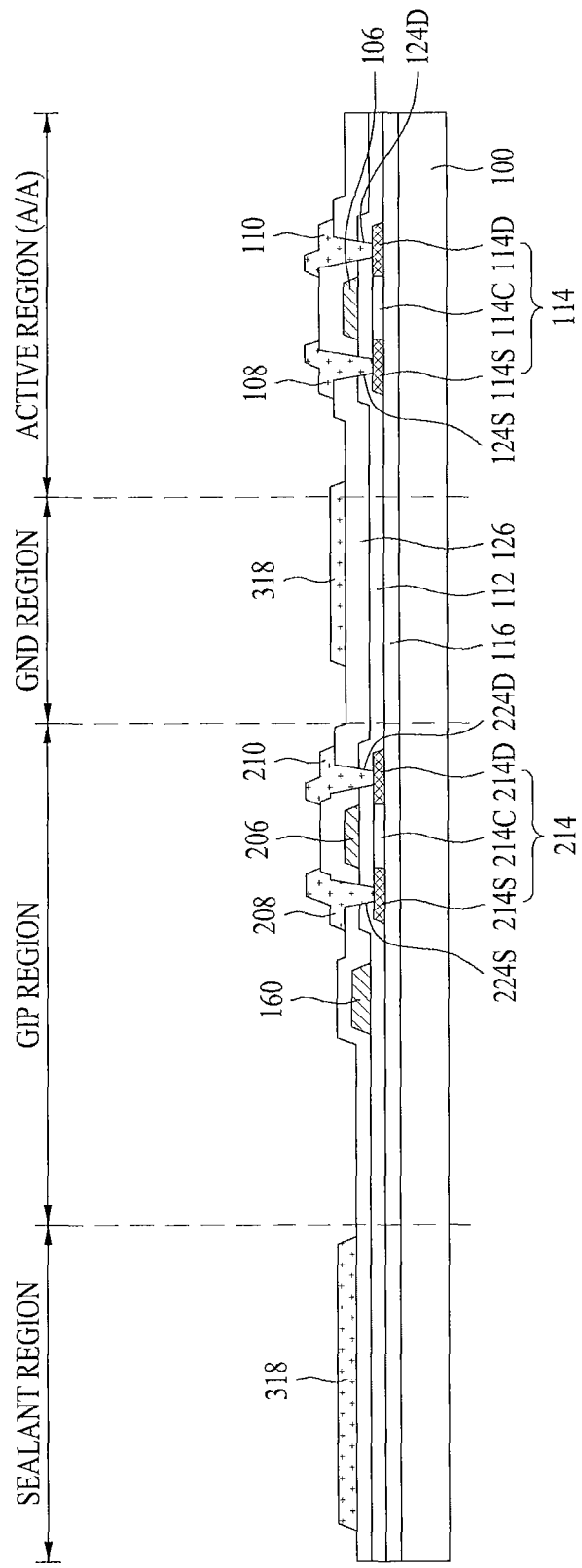
Figure 7E:
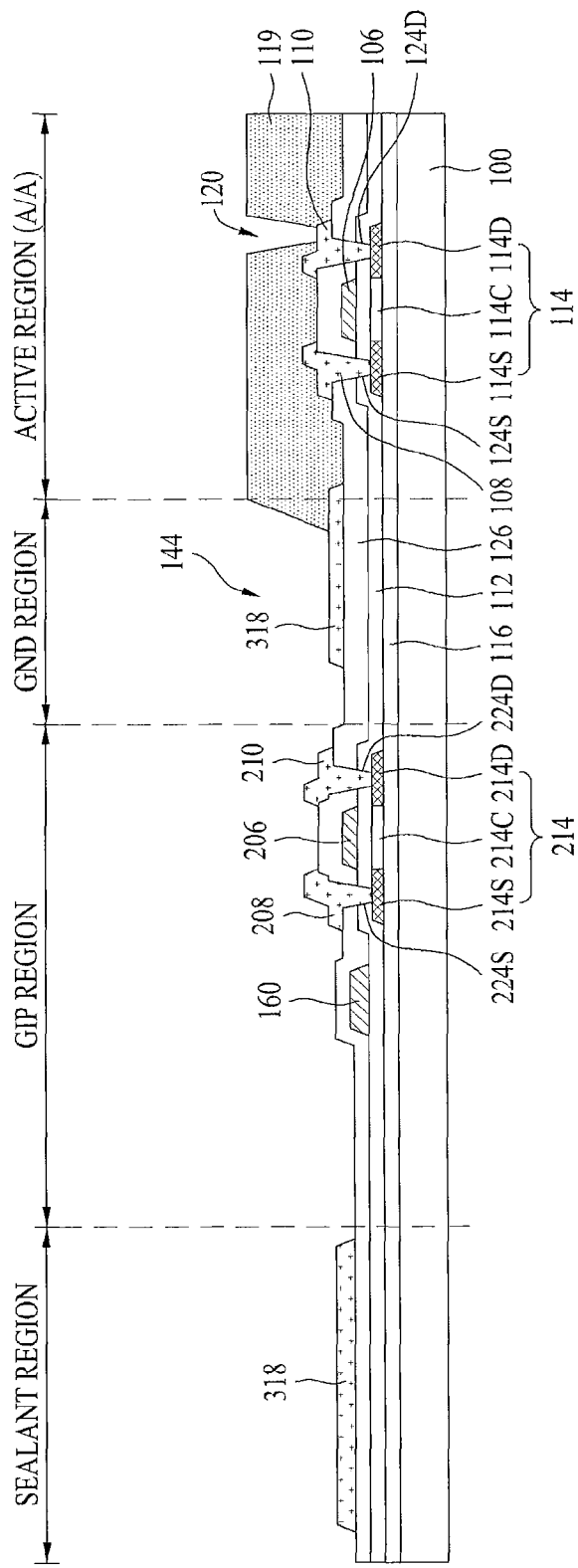

Referring to FIG. 7E, the protective film 119 is formed on the lower substrate 100 which is provided with the pixel driving TFT and the gate driving TFT. The pixel contact hole 120 and the first contact hole 144 are formed so as to penetrate the protective film 119.

In detail, the protective film 119 is made of the organic insulation material on the lower substrate 100 which is provided with the pixel driving TFT and the gate driving TFT. For example, a photo-acrylic (PAC) material may be used as the organic insulation material.

Subsequently, the pixel contact hole 120 and the first contact hole 144 are formed so as to penetrate the protective film 119 through the photolithographic process and the etching process. The pixel contact hole 120 exposes the drain electrode 110 of the pixel driving TFT of the active region, whereas the first contact hole 144 exposes the base voltage line 318 of the GND region. Accordingly, the first contact hole 144 is formed in such a manner that the protective film 119 is removed from the GIP region, the GND region, and the sealant region, except for the active region.

Figure 7F:
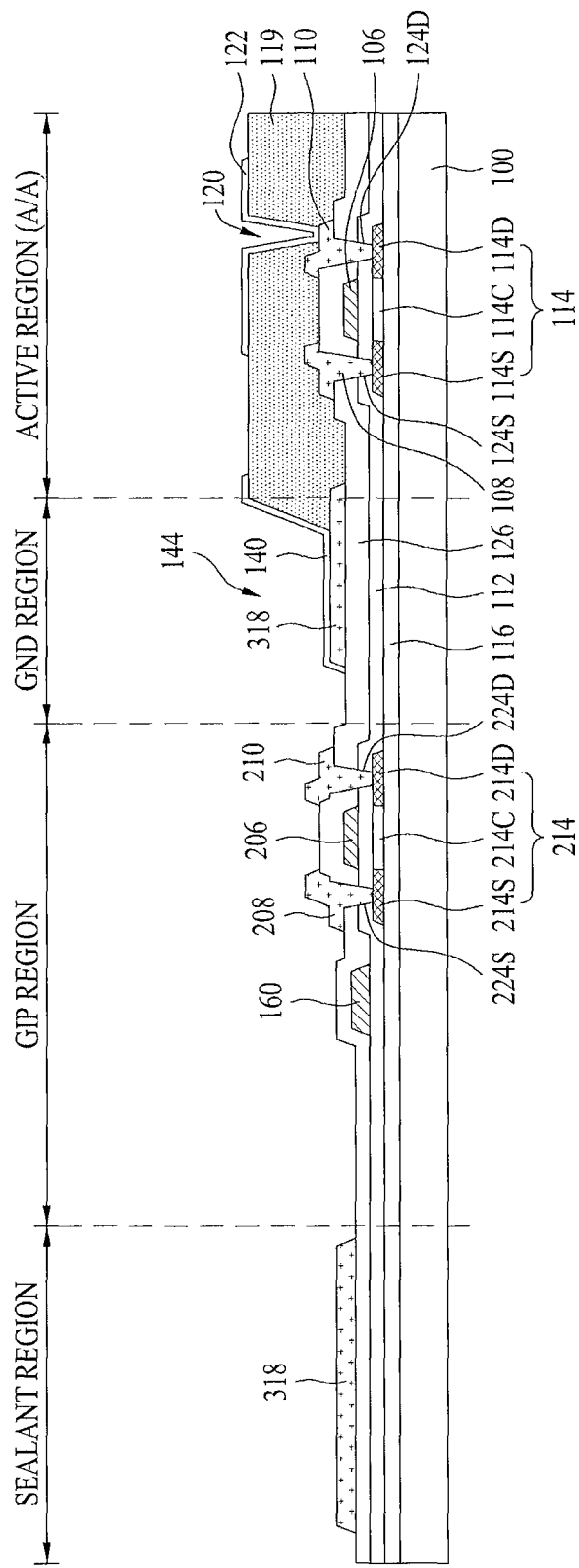

Referring to FIG. 7F, the anode 122 and the connection electrode 140 are formed on the lower substrate 100 which is formed with the protective film 119.

In detail, the anode 122 and the connection electrode 140 are formed in such a manner that a transparent conductive film is deposited on the lower substrate 100 which is formed with the protective film 119, and then the transparent conductive film is patterned by the photolithographic process and the etching process. The anode 122 is connected with the drain electrode 110 of the pixel driving TFT through the pixel contact hole 120, whereas the connection electrode 140 is formed to directly come into contact with the base voltage line 318 which is exposed. Consequently, a contact area between the connection electrode 140 and the base voltage line 318 become wide, thereby enabling resistance reduction.

Figure 7G:
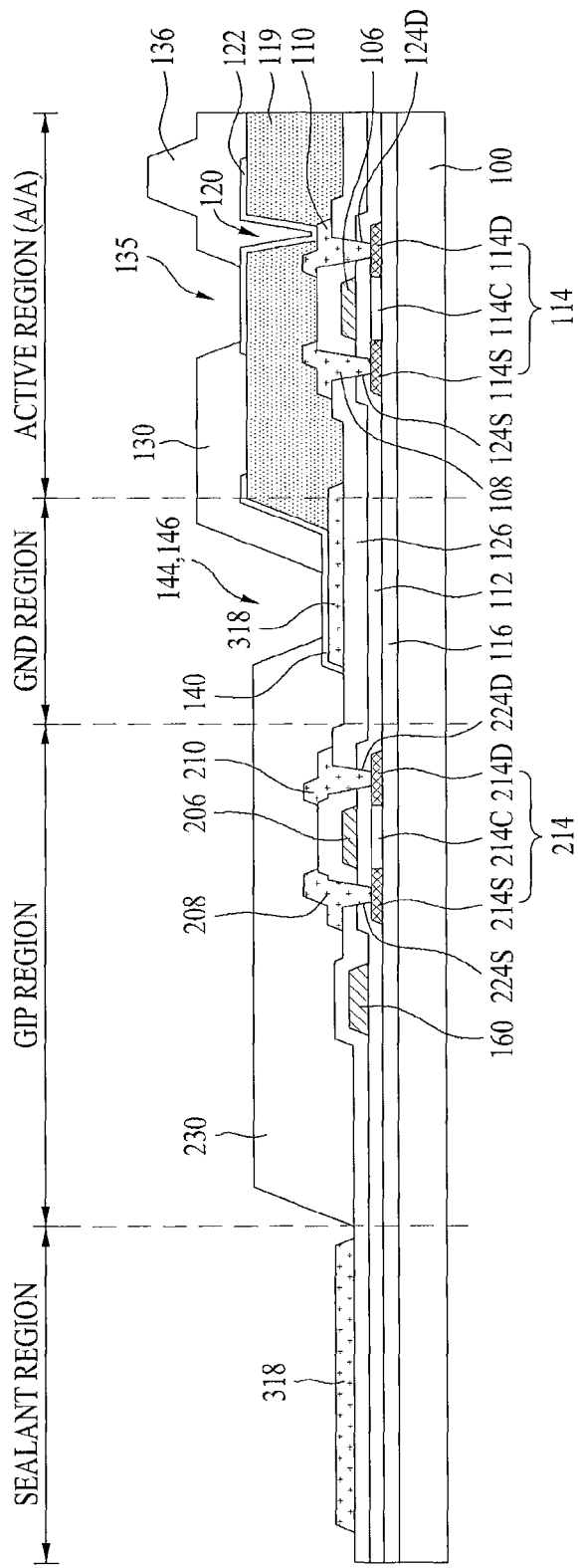

Referring to FIG. 7G, the bank insulation films 130 and 230 and the spacer 136 are simultaneously formed on the lower substrate 100 which is formed with the anode 122 and the connection electrode 140. The bank hole 135, which penetrates the bank insulation films 130, and the second contact hole 146 for exposure of the connection electrode 140 are formed.

In detail, the organic insulation material is fully applied on the lower substrate 100 which is formed with the anode 122 and the connection electrode 140 through a coating process such as spin coating, spinless coating, or the like. Subsequently, an imprint process using a mold frame and a master, or the photolithographic process and the etching process using a slit mask or a half tone mask enables the bank insulation films 130 and 230 and the spacer 136 to be simultaneously formed from the organic insulation material. In this case, the bank insulation films 130 and 230 are formed with the bank hole 135 for exposure of the anode 122 and the second contact hole 146 for exposure of the connection electrode 140, respectively. Accordingly, the second contact hole 146 is provided between the bank insulation film 130 formed on the pixel driving TFT and the bank insulation film 230 formed on the gate driving TFT. Thus, the out-gassing blocking holes composed of the first and second contact holes 144 and 146 are formed.

Figure 7H:
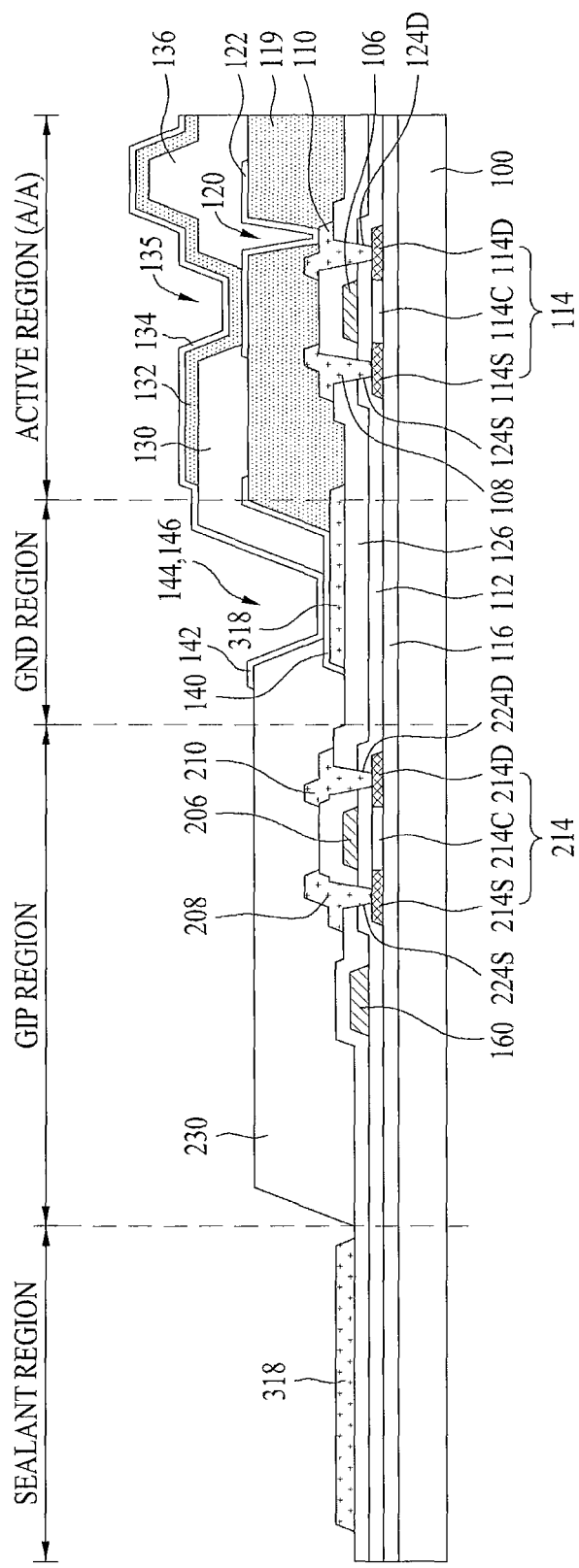
Figure 7I:
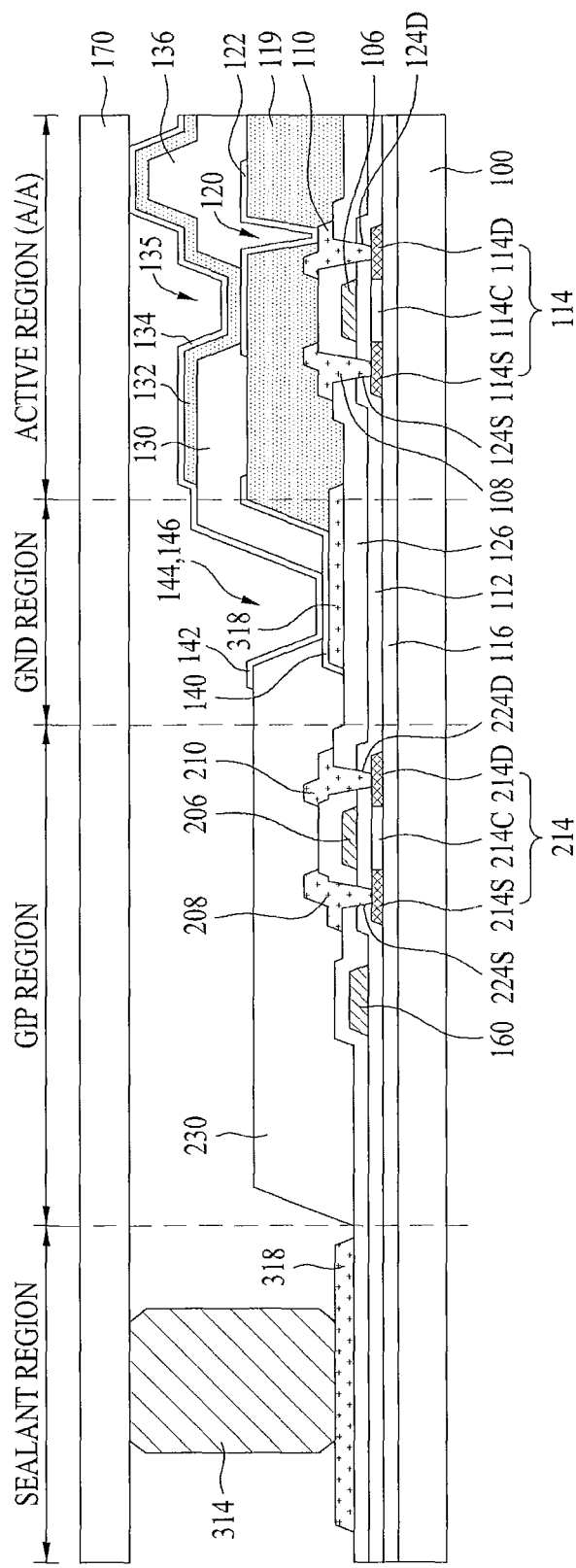

Referring to FIG. 7H, the organic layer 132 and the cathode 134 are sequentially formed on the lower substrate 100 which is formed with the bank insulation films 130 and 230 and the spacer 136. Referring to FIG. 7I, the upper and lower substrates 170 and 100 are attached using a frit seal 314.

As shown in FIGS. 7A to 7H, the method for manufacturing the organic light emitting display device according to the third embodiment of the present invention includes forming the bank insulation films and the spacer at the same time, instead of formation of the inorganic protective film, as compared to the method for manufacturing the organic light emitting display device according to the first embodiment of the present invention. As a result, two mask processes are eliminated.

Figure 8:
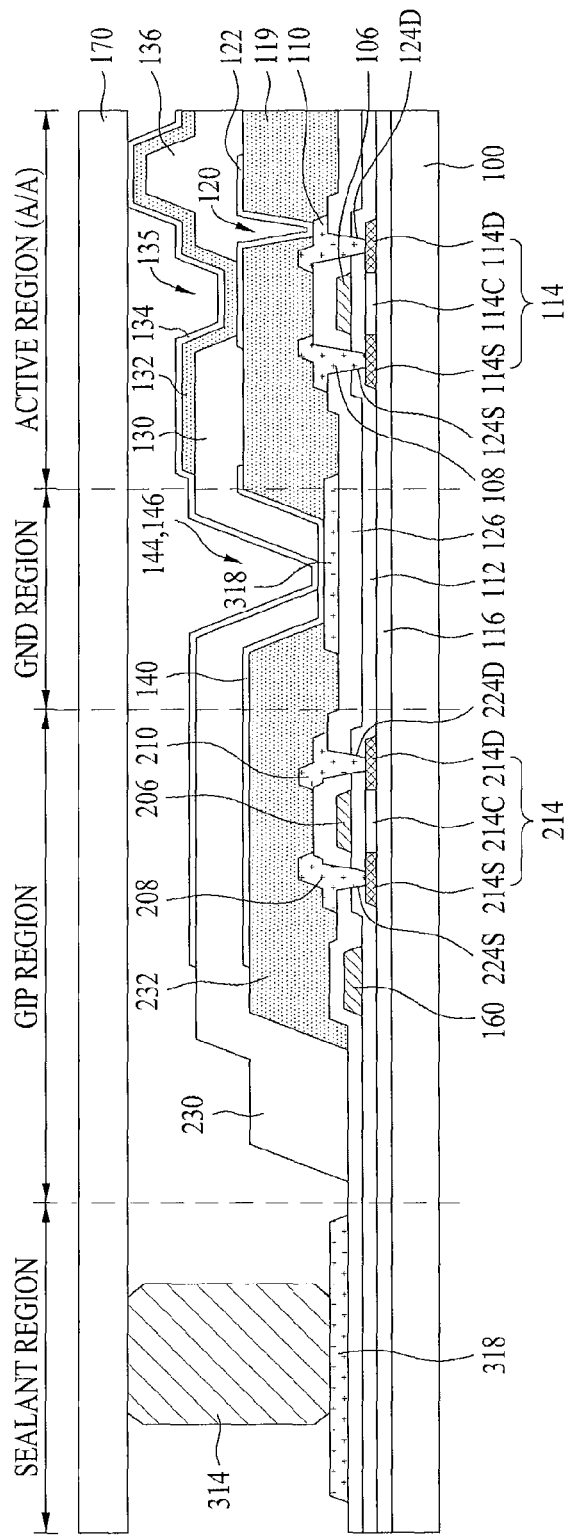
FIG. 8 is a sectional view illustrating an organic light emitting display device according to a fourth embodiment of the present invention.

FIG. 8 is a sectional view illustrating an organic light emitting display device according to a fourth embodiment of the present invention.

The organic light emitting display device according to the fourth embodiment of the present invention includes an organic light emitting display panel equipped with an active region 300 or A/A for displaying an image and a gate driver 312 for driving gate lines GL1 to GLn of the active region 300 or A/A, and a data driver 310 for driving data lines DL1 to DLn of the active region 300 or A/A, as shown in FIG. 1.

The organic light emitting display panel has an upper substrate 170 and a lower substrate 100, which face and are attached to each other. The organic light emitting display panel includes an active region 300 or A/A which includes gate lines GL1 to GLn, data lines DL1 to DLn, power lines PL1 to PLn, and a plurality of pixel areas 320 connected with a base voltage line 318, a GIP region formed with the gate driver 312 for driving the gate lines GL1 to GLn, a GND region formed between the GIP region and the active region to be formed with the base voltage line 318 for supplying base voltage GND to the active region, and a sealant region formed with a sealant 314 for attaching the upper substrate 170 to the lower substrate 100. Each of the plural pixel areas 320 has a pixel switching TFT ST connected with one gate line GL and one data line DL, a pixel driving TFT DT connected with one power line PL and an anode of a corresponding one of the organic luminescent elements, and a storage capacitor C connected between the power line PL and a drain electrode of the pixel switching TFT ST.

In this case, since the organic light emitting display device according to the fourth embodiment of the present invention, as shown in FIG. 8, has the same configuration as the pixel driving TFT and the gate driving TFT of the organic light emitting display device according to the first embodiment of the present invention, no description will be given thereof.

The active region of the organic light emitting display device according to the fourth embodiment of the present invention includes pixel driving TFTs and a protective film 119 made of an organic insulation material on each of the pixel driving TFTs. The GIP region includes gate driving TFTs and a protective film 232 made of an organic insulation material on each of the gate driving TFTs. Since the protective film 232 is further included on the gate driving TFT, a connection electrode 140 may be widely formed up to the GIP region, and a cathode 134 connected with the connection electrode 140 may also be widely formed up to the GIP region. As a result, resistance may be reduced. In the organic light emitting display device according to the fourth embodiment of the present invention, no descriptions of the same configuration as the organic light emitting display device according to the first and third embodiments of the present invention will be given.

The GND region is formed between the GIP region and the active region. The GND region includes the base voltage line 318 for supplying the base voltage to the cathode 134 of each organic luminescent element, and out-gassing blocking holes 144 and 146 for blocking out-gassing occurring from the sealant 314 and a plurality of protective films of the GIP region.

The out-gassing blocking holes 144 and 146 are comprised of a first contact hole 144 which is formed between the protective film 119 formed on the pixel driving TFT and the protective film 232 formed on the gate driving TFT, and a second contact hole 146 which is formed between the bank insulation film 130 formed on the pixel driving TFT and the bank insulation film 230 formed on the gate driving TFT. In this case, each of the protective films 119 and 232 may be made of an organic insulation material, for example, a photo-acrylic material. In addition, although the protective film 232 formed at the GIP region is made of the photo-acrylic material, the out-gassing occurring from the GIP region may be blocked by the out-gassing blocking holes 144 and 146.

Accordingly, in accordance with the present invention, since the protective film is made of photo-acrylic material in the GIP region, costs may be maintained. Also, since the protective film is formed on the gate driving TFT so that the connection electrode is widely formed up to the GIP region, the present invention has an effect of achieving improved reduction of resistance at the same cost.

FIGS. 9A to 9I are sectional views illustrating a method for manufacturing the organic light emitting display device shown in FIG. 8 according to the fourth embodiment of the present invention.

In the method for manufacturing the organic light emitting display device shown in FIGS. 9A to 9D according to the fourth embodiment of the present invention, since a fabrication process of the pixel driving TFT formed at the active region and a fabrication process of the gate driving TFT formed at the GIP region are the same as the method for manufacturing the organic light emitting display device shown in FIGS. 3A to 3D according to the second embodiment of the present invention, no description will be given thereof.

Referring to FIG. 9E, the protective films 119 and 232 are formed on the lower substrate 100 which is provided with the pixel driving TFT and the gate driving TFT, respectively. The pixel contact hole 120 and the first contact hole 144 are formed so as to penetrate the protective films 119 and 232, respectively.

In detail, each of the protective films 119 and 232 is made of the organic insulation material on the lower substrate 100 which is provided with the pixel driving TFT and the gate driving TFT. For example, a photo-acrylic (PAC) material may be used as the organic insulation material.

Subsequently, the pixel contact hole 120 and the first contact hole 144 are formed so as to respectively penetrate the protective films 119 and 232 through the photolithographic process and the etching process. The pixel contact hole 120 exposes the drain electrode 110 of the pixel driving TFT of the active region, whereas the first contact hole 144 exposes the base voltage line 318 of the GND region. The first contact hole 144 is provided between the protective film 119 formed on the pixel driving TFT and the protective film 232 formed on the gate driving TFT.

Figure 9A:
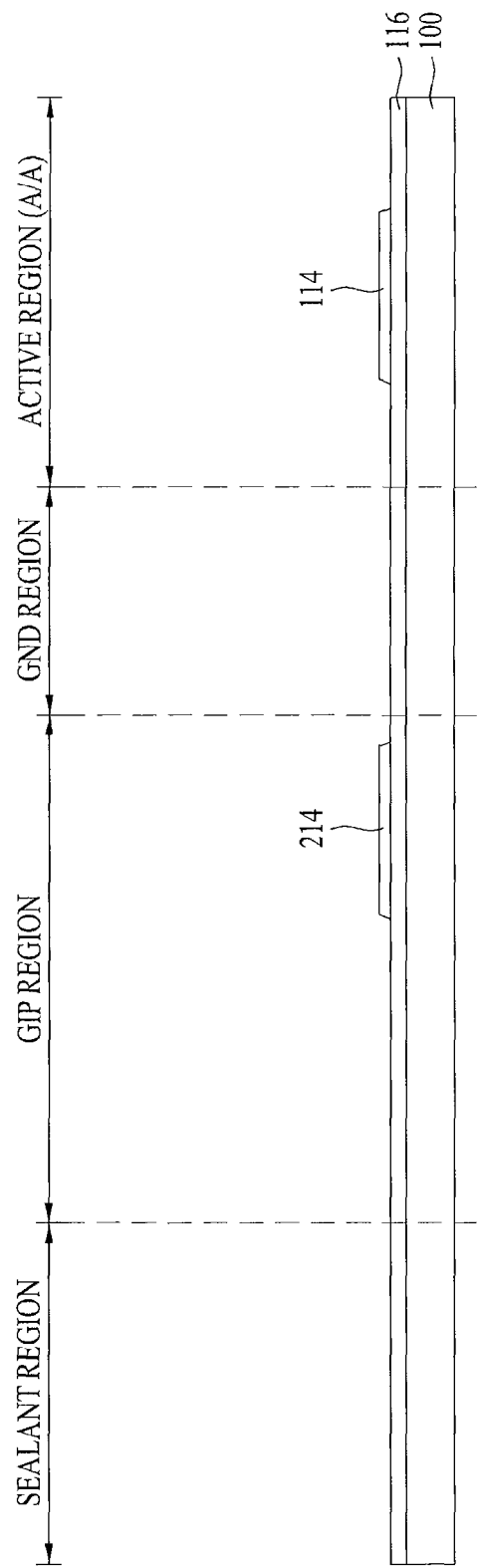
Figure 9B:
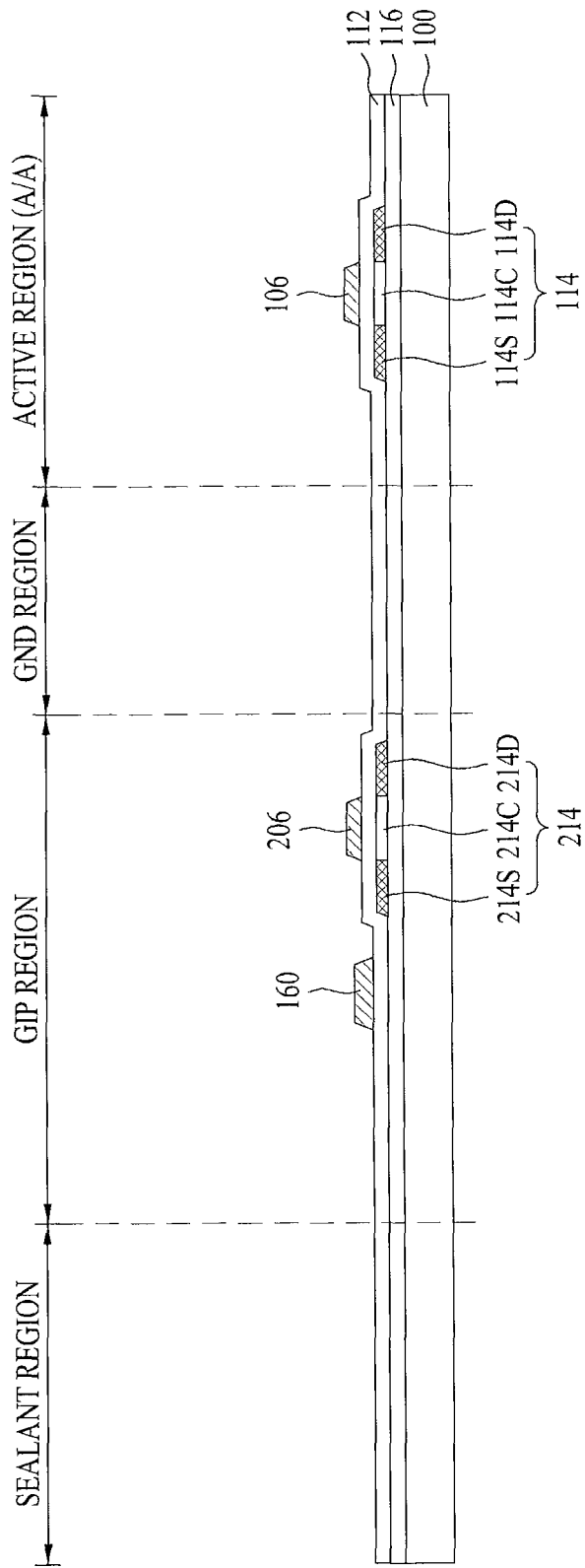
Figure 9C:
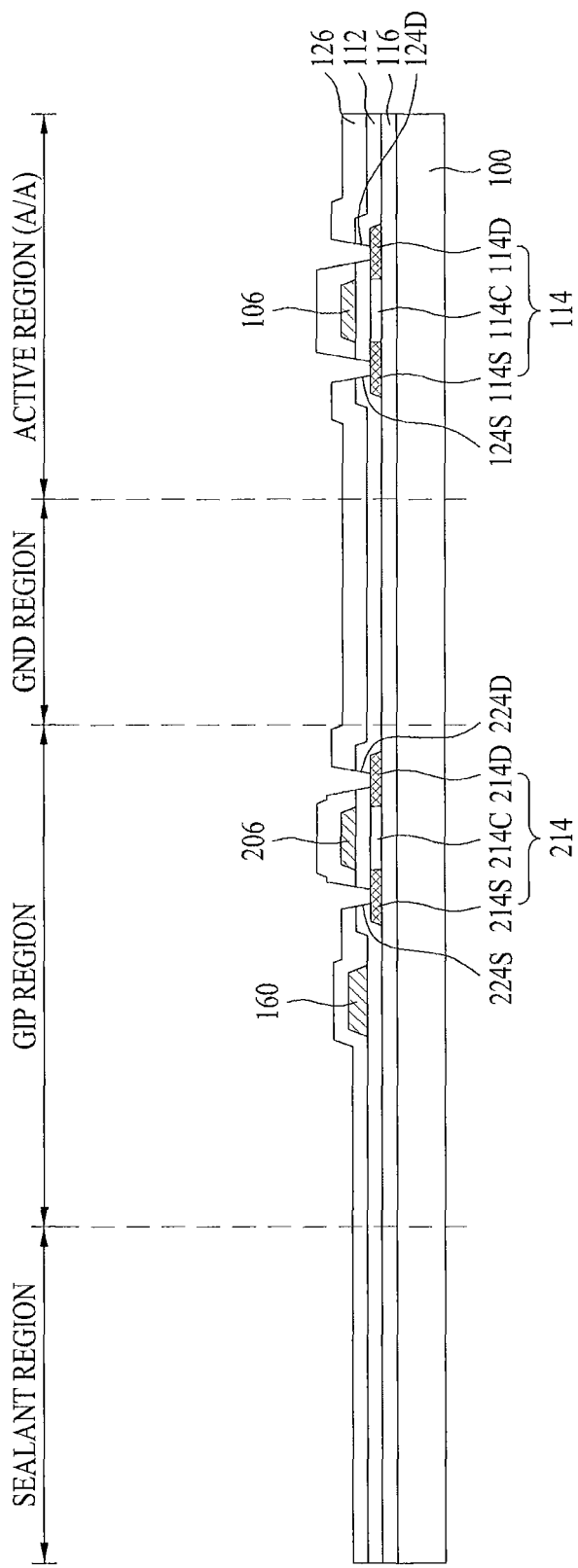
Figure 9D:
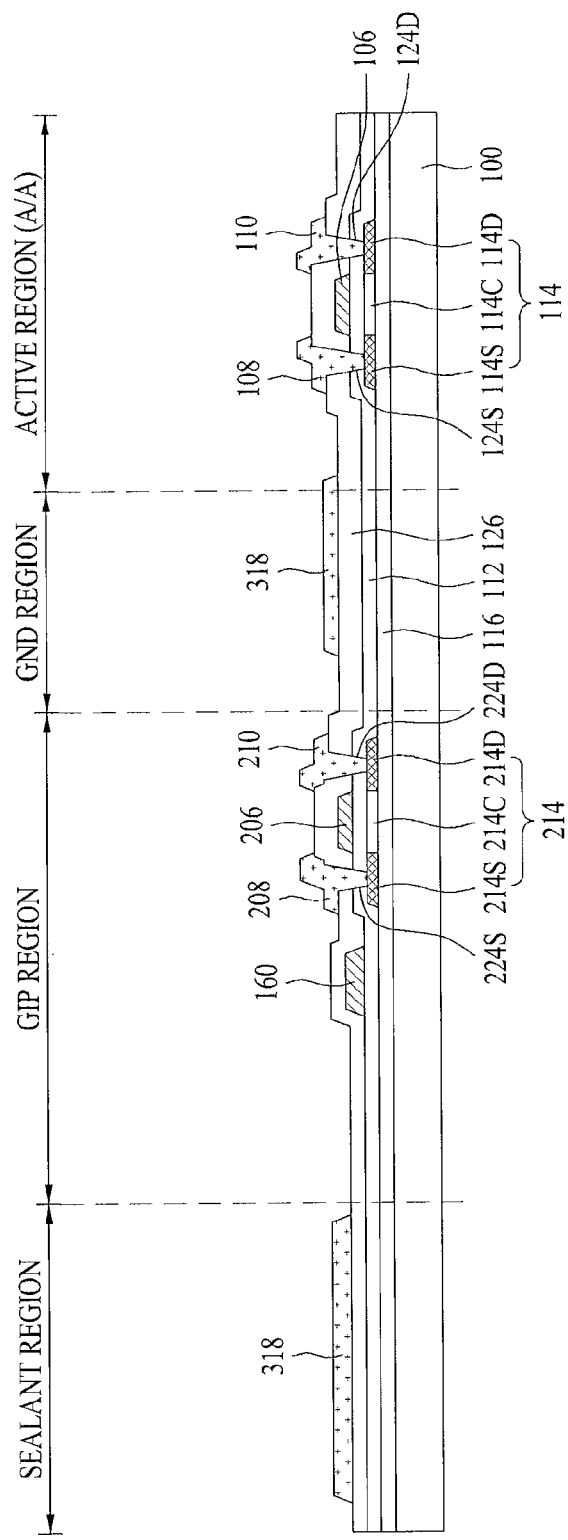
Figure 9F:
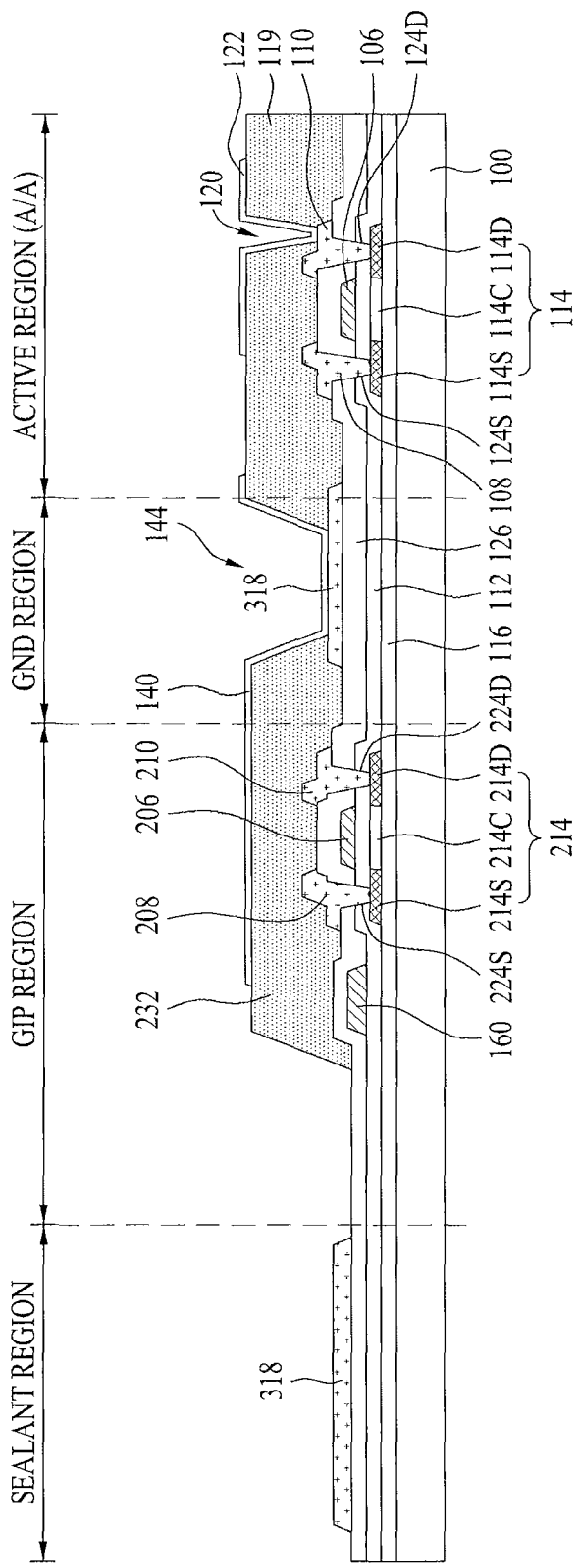

Referring to FIG. 9F, the anode 122 and the connection electrode 140 are formed on the lower substrate 100 which is formed with the protective films 119 and 232.

In detail, the anode 122 and the connection electrode 140 are formed in such a manner that a transparent conductive film is deposited on the lower substrate 100 which is formed with the protective films 119 and 232, and then the transparent conductive film is patterned by the photolithographic process and the etching process. The anode 122 is connected with the drain electrode 110 of the pixel driving TFT through the pixel contact hole 120, whereas the connection electrode 140 is connected with the base voltage line 318 through the first contact hole 144. In this case, the connection electrode 140 is formed to extend up to the GIP region.

Figure 9G:
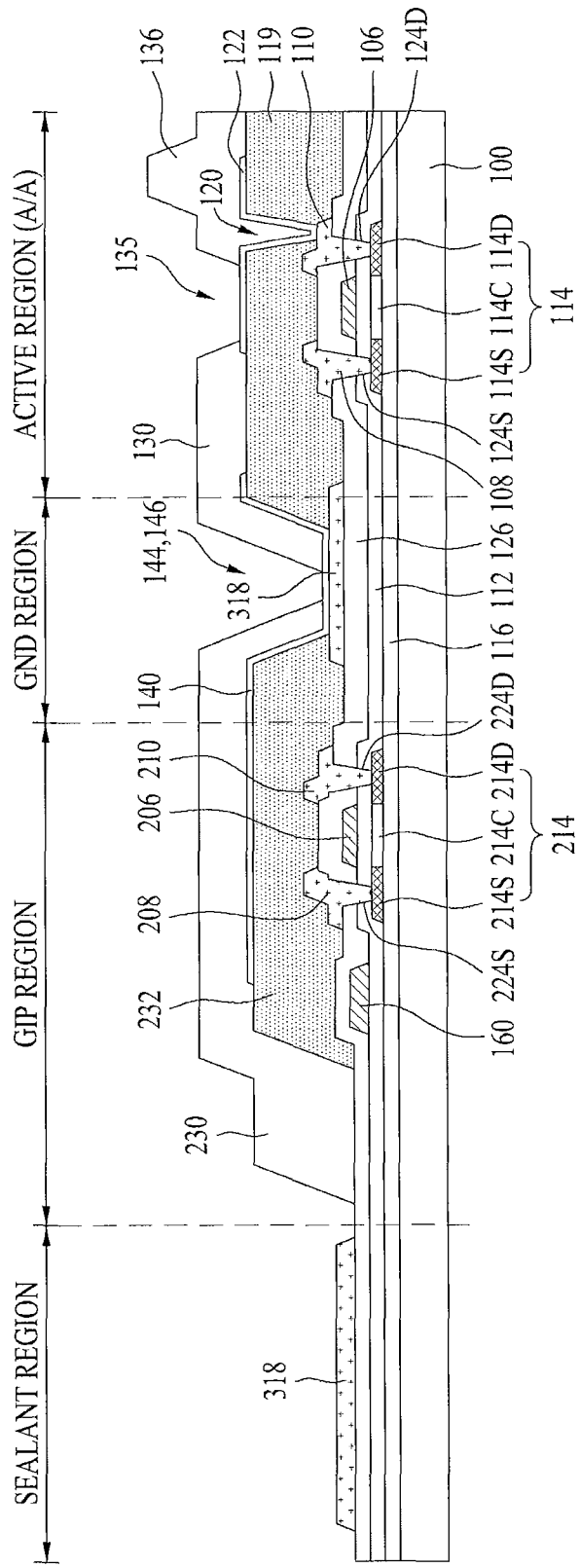

Referring to FIG. 9G, the bank insulation films 130 and 230 and the spacer 136 are simultaneously formed on the lower substrate 100 which is formed with the anode 122 and the connection electrode 140. The bank hole 135, which penetrates the bank insulation films 130, and the second contact hole 146 for exposure of the connection electrode 140 are formed. Since the process related to this is the same as that shown in FIG. 7G of the method for manufacturing the organic light emitting display device according to the third embodiment of the present invention, no description will be given thereof.

Figure 9H:
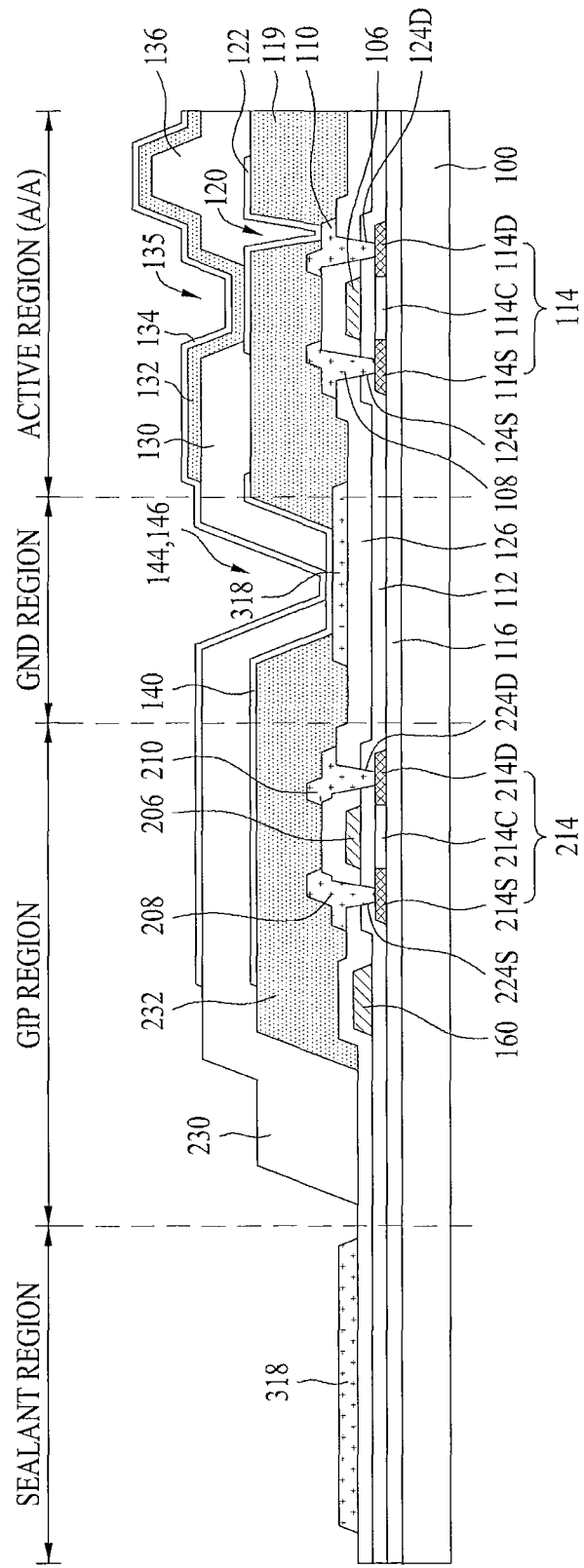
Figure 9I:
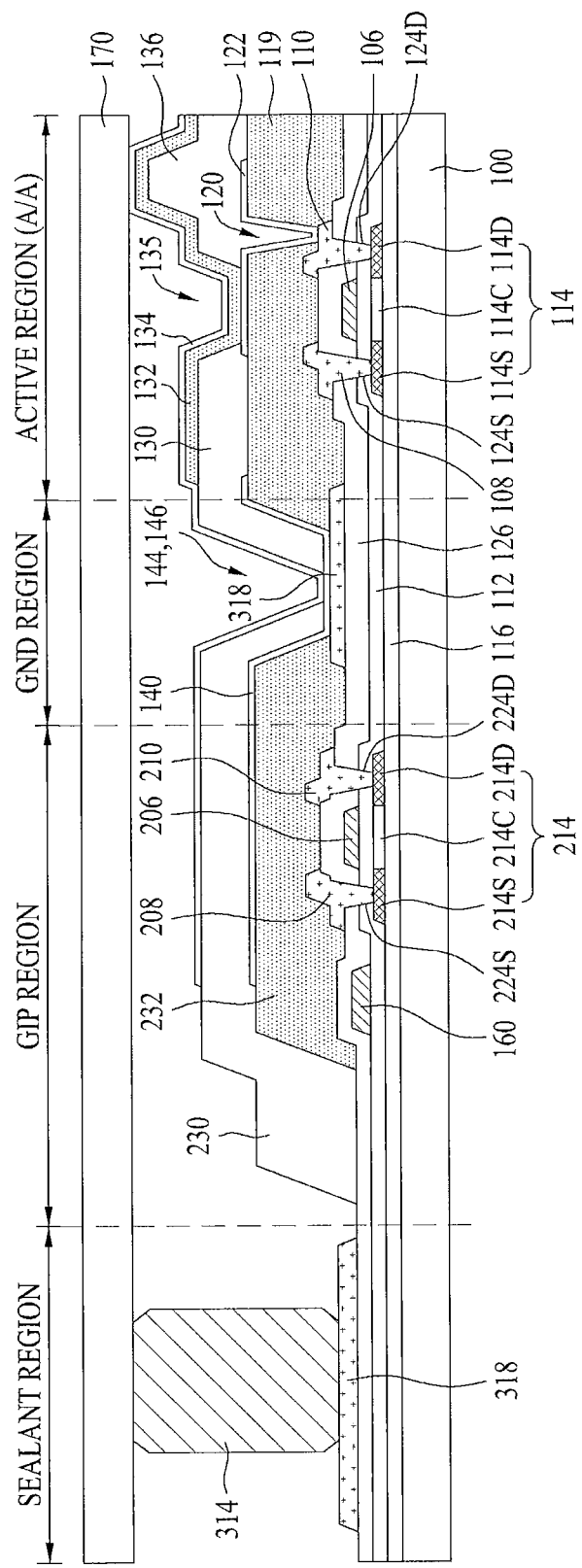

Referring to FIG. 9H, the organic layer 132 and the cathode 134 are sequentially formed on the lower substrate 100 which is formed with the bank insulation films 130 and 230 and the spacer 136. The cathode 134 is widely formed up to the GIP region. Referring to FIG. 9I, the upper and lower substrates 170 and 100 are attached using a frit seal 314.

Figure 10:
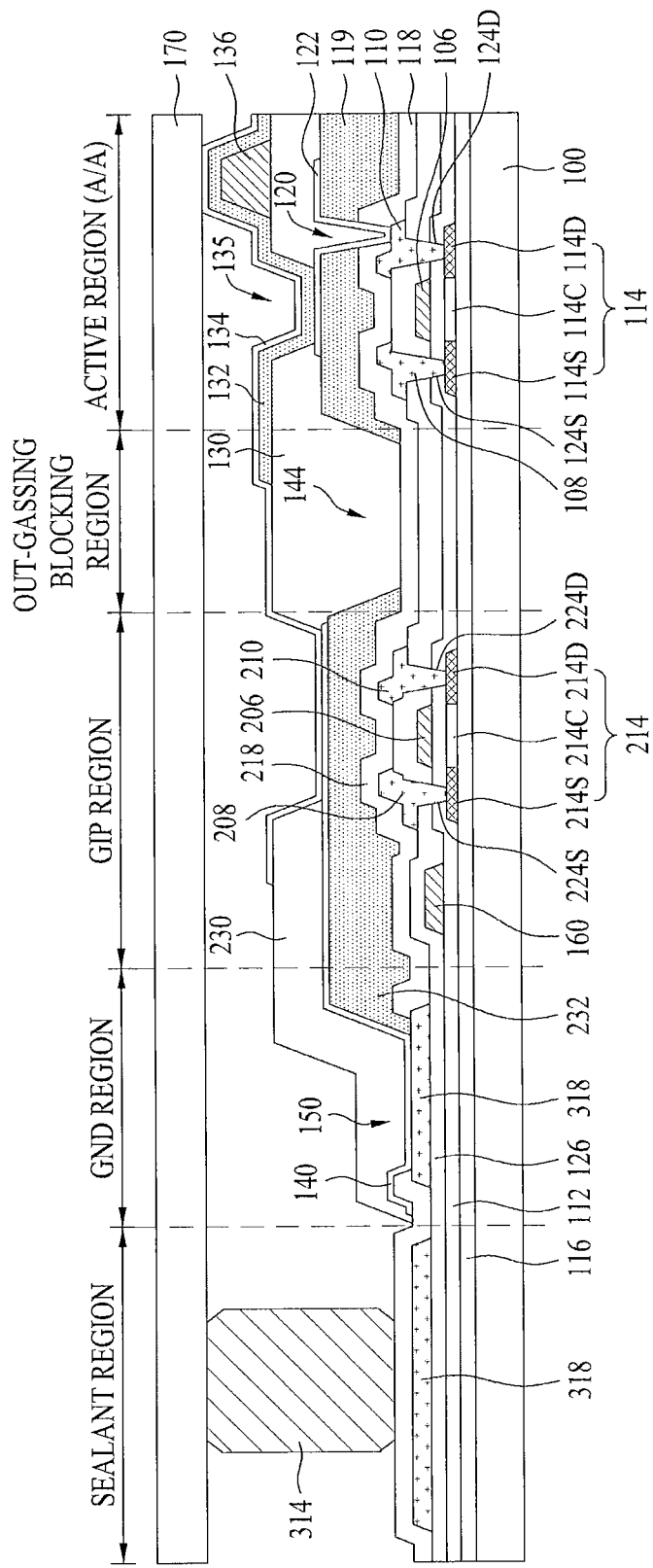
FIG. 10 is a sectional view illustrating an organic light emitting display device according to a fifth embodiment of the present invention.

FIG. 10 is a sectional view illustrating an organic light emitting display device according to a fifth embodiment of the present invention.

The organic light emitting display device according to the fifth embodiment of the present invention includes an organic light emitting display panel equipped with an active region for displaying an image and a gate driver for driving gate lines of the active region, and a data driver for driving data lines of the active region.

The organic light emitting display panel has an upper substrate and a lower substrate, which face and are attached to each other. The organic light emitting display panel includes an active region which includes gate lines, data lines, power lines, and a plurality of pixel areas connected with a base voltage line, a GIP region formed with the gate driver for driving the gate lines, an out-gassing blocking region formed between the GIP region and the active region so as to block out-gassing occurring from the GIP region, a GND region formed with the base voltage line for supplying base voltage GND to the active region, and a sealant region formed with a sealant for attaching the upper substrate to the lower substrate.

Each of the plural pixel areas has a pixel switching TFT connected with one gate line and one data line, a pixel driving TFT connected with one power line and an anode of a corresponding one of the organic luminescent elements, and a storage capacitor connected between the power line and a drain electrode of the pixel switching TFT.

In this case, since the organic light emitting display device according to the fifth embodiment of the present invention, as shown in FIG. 10, has the same configurations as those of the pixel driving TFT and the gate driving TFT of the organic light emitting display device according to the first embodiment of the present invention, no description will be given thereof.

The active region of the organic light emitting display device according to the fifth embodiment of the present invention includes pixel driving TFTs, and a first protective film 118 made of an inorganic insulation material and a second protective film 119 made of an organic insulation material on each of the pixel driving TFTs. The GIP region includes gate driving TFTs, and a first protective film 218 made of an inorganic insulation material and a second protective film 232 made of an organic insulation material on each of the gate driving TFTs. An out-gassing blocking hole 144 is provided between the second protective film 119 formed on the pixel driving TFT and the second protective film 232 formed on the gate driving TFT. Thus, out-gassing occurring from the GIP region may be blocked so as not to move to the active region.

Figure 11:
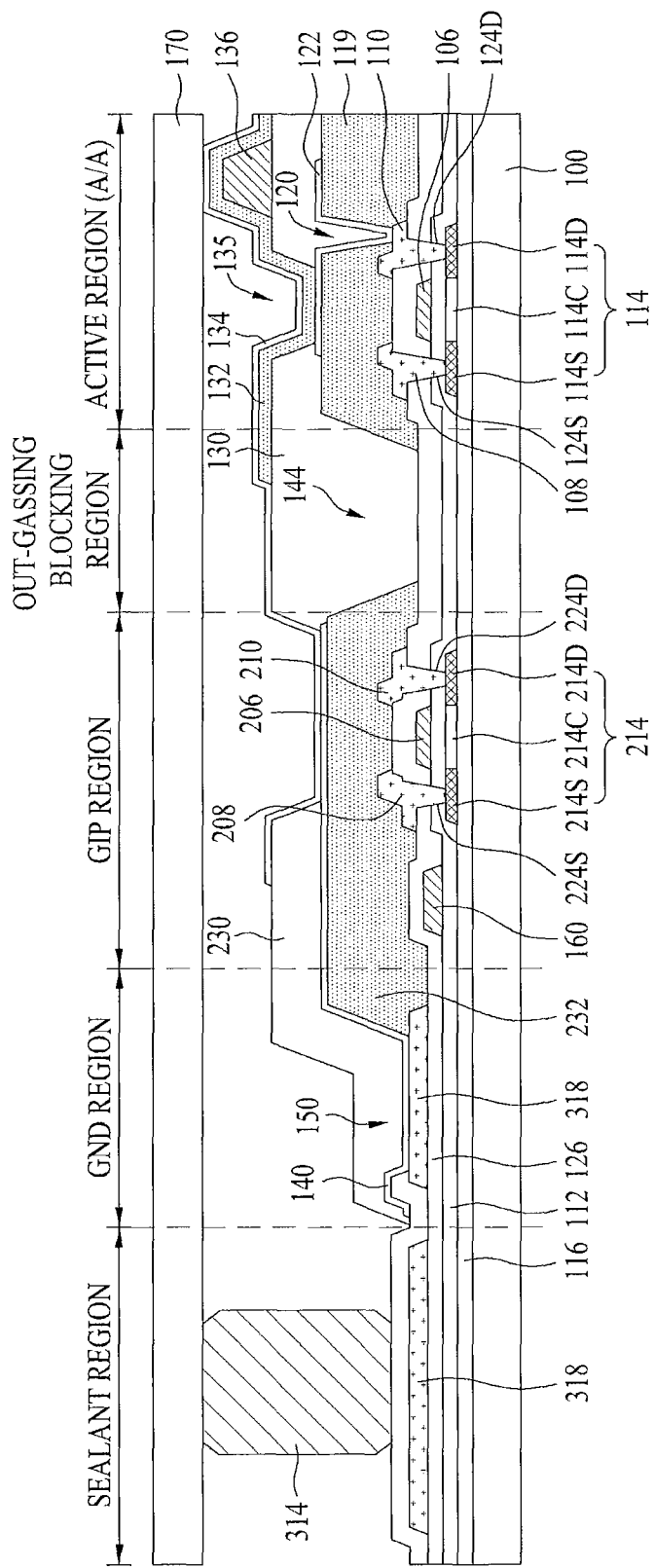
FIG. 11 is a sectional view illustrating an organic light emitting display device according to a sixth embodiment of the present invention.

FIG. 11 is a sectional view illustrating an organic light emitting display device according to a sixth embodiment of the present invention.

Since the organic light emitting display device according to the sixth embodiment of the present invention is the same as the organic light emitting display device according to the fifth embodiment of the present invention, except that the inorganic protective films (the first protective films) are removed, and bank insulation films and a spacer are simultaneously formed, no description will be given thereof. Accordingly, the organic light emitting display device according to the sixth embodiment of the present invention has a process of removing the protective films, and a process of forming the bank insulation films and the spacer at the same time, as compared to the organic light emitting display device according to the fifth embodiment of the present invention. As a result, the number of processes may be reduced.

As is apparent from the above description, an organic light emitting display device according to the present invention includes an active region which includes gate lines, data lines, power lines, and a plurality of pixel areas connected with a base voltage line, a GIP region formed with a gate driver for driving the gate lines, a GND region formed between the GIP region and the active region to be formed with the base voltage line for supplying base voltage to the active region, and a sealant region formed with a sealant for attaching an upper substrate to a lower substrate. The GIP region includes out-gassing blocking holes for blocking out-gassing occurring from the sealant and at least one protective film formed at the GIP region.

As described above, in accordance with the present invention, the GND region is located between the active region and the GIP region, such that the out-gassing occurring from the GIP region may be blocked through the out-gassing blocking holes formed at the GND region. As a result, the out-gassing does not infiltrate into an organic layer of each organic luminescent element, thereby achieving enhancement in lifespan and luminous characteristics of the organic luminescent element.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. An organic light emitting display device including an organic light emitting display panel and a data driver that drives data lines of the organic light emitting display panel, wherein the organic light emitting display panel comprises:
    an active region which includes pixel driving TFTs that embodies an image and organic luminescent elements respectively connected with the pixel driving TFTs to emit light;
    a GIP region, which includes a gate driver with a plurality of gate driving TFTs that respectively drive gate lines of the active region;
    a GND region between the GIP region and the active region to be formed with a base voltage line that supplies base voltage to the organic luminescent elements of the active region; and a sealant region having a sealant that attaches an upper substrate to a lower substrate, and wherein:
the GND region includes out-gassing blocking holes that block out-gassing occurring from the sealant and at least one protective-insulating film formed at the GIP region, and the number insulating films on the gate driving TFTs at the GIP region is smaller than the number insulating films on the pixel driving TFTs at the active region.

2. The organic light emitting display device according to claim 1, wherein the GIP region is adjacent to the sealant region.

3. The organic light emitting display device according to claim 1, wherein each of the organic luminescent elements comprises:
an anode connected with a drain electrode of each pixel driving TFT;
a bank insulation film having a bank hole for exposure of the anode;
a column spacer formed on the bank insulation film so as to maintain a cell gap; and
an organic layer on the anode which is exposed through the bank hole, and a cathode formed on the organic layer.

4. The organic light emitting display device according to claim 3, wherein:
each pixel driving TFT at the active region has a first protective film made of an inorganic insulation material, a second protective film made of an organic insulation material on the first protective film, and the bank insulation film on the second protective film; and
each gate driving TFT formed at the GIP region is formed with a first protective film made of the inorganic insulation material and a bank insulation film formed on the first protective film.

5. The organic light emitting display device according to claim 4, wherein the out-gassing blocking holes comprise:
a first contact hole between the first protective film formed on each pixel driving TFT and the first protective film on each gate driving TFT;
a second contact hole between the second protective film formed on the pixel driving TFT and the first protective film on the gate driving TFT; and
a third contact hole between the bank insulation film formed on the pixel driving TFT and the bank insulation film on the gate driving TFT.

6. The organic light emitting display device according to claim 4, wherein the first protective film is made of the inorganic insulation material, each of the second protective film and the bank insulation film is made of the organic insulation material, the second protective film is made of a photo-acrylic material, and the bank insulation film is made of a polyimide material.

7. The organic light emitting display device according to claim 3, wherein:
each pixel driving TFT at the active region has a protective film made of an organic insulation material and the bank insulation film on the protective film; and
each gate driving TFT at the GIP region is formed with a bank insulation film.

8. The organic light emitting display device according to claim 7, wherein the out-gassing blocking holes comprise:
a first contact hole between the protective film on each pixel driving TFT and the bank insulation film on each gate driving TFT; and a second contact hole between the bank insulation film formed on the pixel driving TFT and the bank insulation film on the gate driving TFT.

9. The organic light emitting display device according to claim 7, wherein each of the protective film and the bank insulation film is made of the organic insulation material, the protective film is made of a photo-acrylic material, and the bank insulation film is made of a polyimide material.

10. The organic light emitting display device according to claim 1, further comprising:
a connection electrode connecting a base voltage line with a cathode of the organic emitting elements through the out-gassing blocking holes.

11. A method for manufacturing an organic light emitting display device which includes an organic light emitting display panel including an active region which includes pixel driving TFTs for embodying an image and organic luminescent elements respectively connected with the pixel driving TFTs to emit light, a GIP region which includes a gate driver formed with a plurality of gate driving TFTs for respectively driving gate lines of the active region, a GND region formed between the GIP region and the active region to be formed with a base voltage line for supplying base voltage to the organic luminescent elements of the active region, and a sealant region formed with a sealant for attaching an upper substrate to a lower substrate, and a data driver for driving data lines of the organic light emitting display panel, the method for manufacturing the organic light emitting display device comprising:
providing the pixel driving TFTs on a substrate of the active region and the gate driving TFTs on a substrate of the GIP region;
forming first protective films on each pixel driving TFT and each gate driving TFT, respectively, so as to form a first contact hole between the first protective film formed on the pixel driving TFT and the first protective film formed on the gate driving TFT;
forming a second protective film on the pixel driving TFT so as to form a second contact hole between the second protective film formed on the pixel driving TFT and the first protective film formed on the gate driving TFT; and
forming bank insulation films on the respective pixel driving TFT and gate driving TFT so as to form a third contact hole between the bank insulation film formed on the pixel driving TFT and the bank insulation film formed on the gate driving TFT,
wherein the first to third contact holes overlap each other to form out-gassing blocking holes.

12. The method for manufacturing the organic light emitting display device according to claim 11, wherein the first protective film is made of the inorganic insulation material, each of the second protective film and the bank insulation film is made of the organic insulation material, the second protective film is made of a photo-acrylic material, and the bank insulation film is made of a polyimide material.

13. The method for manufacturing the organic light emitting display device according to claim 12, wherein each of the organic luminescent elements is provided by:
forming, after formation of the first contact hole, an anode connected with a drain electrode of each pixel driving TFT and a connection electrode on the first contact hole in order to connect the base voltage line and a cathode;
forming a spacer on the bank insulation film after formation of the bank insulation film or simultaneously with formation of the bank insulation film; and
forming an organic layer and a cathode on the spacer.

14. A method for manufacturing an organic light emitting display device which includes an organic light emitting display panel including an active region which includes pixel driving TFTs for embodying an image and organic luminescent elements respectively connected with the pixel driving TFTs to emit light, a GIP region which includes a gate driver formed with a plurality of gate driving TFTs for respectively driving gate lines of the active region, a GND region formed between the GIP region and the active region to be formed with a base voltage line for supplying base voltage to the organic luminescent elements of the active region, and a sealant region formed with a sealant for attaching an upper substrate to a lower substrate, and a data driver for driving data lines of the organic light emitting display panel, the method for manufacturing the organic light emitting display device comprising:
  providing the pixel driving TFTs on a substrate of the active region and the gate driving TFTs on a substrate of the GIP region;
  forming first protective films on each pixel driving TFT and each gate driving TFT, respectively, so as to form a first contact hole between the first protective film formed on the pixel driving TFT and the first protective film formed on the gate driving TFT;
  forming second protective films on the respective pixel driving TFT and gate driving TFT so as to form a second contact hole between the second protective film formed on the pixel driving TFT and the second protective film formed on the gate driving TFT; and
  forming bank insulation films on the respective pixel driving TFT and gate driving TFT so as to form a third contact hole between the bank insulation film formed on the pixel driving TFT and the bank insulation film formed on the gate driving TFT,
  wherein the first to third contact holes overlap each other to form out-gassing blocking holes.

15. The method for manufacturing the organic light emitting display device according to claim 14, wherein the first protective film is made of the inorganic insulation material, each of the second protective film and the bank insulation film is made of the organic insulation material, the second protective film is made of a photo-acrylic material, and the bank insulation film is made of a polyimide material.

16. The method for manufacturing the organic light emitting display device according to claim 15, wherein each of the organic luminescent elements is provided by:
  forming, after formation of the first contact hole, an anode connected with a drain electrode of each pixel driving TFT and a connection electrode on the first contact hole in order to connect the base voltage line and a cathode;
  forming a spacer on the bank insulation film after formation of the bank insulation film or simultaneously with formation of the bank insulation film; and
  forming an organic layer and a cathode on the spacer, and wherein the cathode and connection electrode are formed up to the GIP region.

17. An organic light emitting display device including an organic light emitting display panel and a data driver for driving data lines of the organic light emitting display panel, wherein the organic light emitting display panel comprises:
  an active region which includes pixel driving TFTs for embodying an image and organic luminescent elements respectively connected with the pixel driving TFTs to emit light;
  a GIP region which includes a gate driver formed with a plurality of gate driving TFTs for respectively driving gate lines of the active region;
  an out-gassing blocking hole formed between the GIP region and the active region so as to block out-gassing occurring from the GIP region;
  a GND region formed with a base voltage line for supplying base voltage to the active region; and
  a sealant region formed with a sealant for attaching an upper substrate to a lower substrate,
  wherein:
  the out-gassing blocking hole is formed between at least one insulating film on the pixel driving TFTs and at least one insulating film the gate driving TFTs the GIP region, and
  a connection electrode connects with a cathode of the organic luminescent elements through a contact hole, that is formed the GIP region not to overlap the out-gassing blocking hole, the connection electrode connecting with a base voltage line.

18. The organic light emitting display device according to claim 17, wherein each of the pixel driving TFTs and each of the gate driving TFTs are formed with protective films, respectively.

19. The organic light emitting display device according to claim 18, wherein the out-gassing blocking hole is formed between the protective film formed on each pixel driving TFT and the protective film formed on each gate driving TFT.

20. An organic light emitting display panel comprises:
  an active region which includes pixel driving TFTs and organic luminescent elements respectively connected with the pixel driving TFTs;
  a GIP region, which includes a gate driver with a plurality of gate driving TFTs that drive gate lines of the active region;
  a GND region between the GIP region and the active region to be formed with a base voltage line that supplies a base voltage to the organic luminescent elements of the active region;
  a sealant region having a sealant that attaches an upper substrate to a lower substrate;
  out-gassing blocking holes between at least one insulating film on the pixel driving TFTs and at least one insulating film on the gate driving TFTs; and
  a connect electrode connecting a base voltage line with a cathode of the organic luminescent elements through the out-gassing blocking holes,
  wherein the connect electrode is extended into the GIP region to cover the gate driving TFTs.

21. The organic light emitting display device according to claim 20, wherein:
  each pixel driving TFT at the active region is has a first protective film made of an inorganic insulation material, a second protective film made of an organic insulation material on the first protective film, and a bank insulation film on the second protective film; and
  each gate driving TFT formed at the GIP region is formed with a first protective film made of the inorganic insulation material, a second protective film made of the organic insulation material on the first protective film, and a bank insulation film formed on the second protective film.

22. The organic light emitting display device according to claim 21, wherein the out-gassing blocking holes comprise:
  a first contact hole between the first protective film formed on each pixel driving TFT and the first protective film on each gate driving TFT;
  a second contact hole between the second protective film on the pixel driving TFT and the second protective film formed on the gate driving TFT; and a third contact hole between the bank insulation film formed on the pixel driving TFT and the bank insulation film on the gate driving TFT.

23. The organic light emitting display device according to claim 20, wherein:
   each pixel driving TFT at the active region has a protective film made of an organic insulation material and a bank insulation film on the protective film; and
   each gate driving TFT at the GIP region is formed with a protective film made of the organic insulation material and a bank insulation film formed on the protective film.

24. The organic light emitting display device according to claim 23, wherein the out-gassing blocking holes comprise:
   a first contact hole between the protective film on each pixel driving TFT and the protective film on each gate driving TFT; and
   a second contact hole between the bank insulation film formed on the pixel driving TFT and the bank insulation film on the gate driving TFT.

* * * * *